United States Patent
Gathman et al.

(10) Patent No.: US 11,632,098 B2
(45) Date of Patent: Apr. 18, 2023

(54) POLYPHASE FILTER WITH INTERPHASE COUPLING

(71) Applicant: Qualcomm Incorporated, San Diego, CA (US)

(72) Inventors: Timothy Donald Gathman, San Diego, CA (US); Lai Kan Leung, San Marcos, CA (US); Chirag Dipak Patel, San Diego, CA (US); Xinmin Yu, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/211,716

(22) Filed: Mar. 24, 2021

(65) Prior Publication Data

US 2022/0311423 A1    Sep. 29, 2022

(51) Int. Cl.
*H03H 11/22* (2006.01)
*H03H 11/04* (2006.01)

(52) U.S. Cl.
CPC ..... *H03H 11/22* (2013.01); *H03H 2011/0494* (2013.01)

(58) Field of Classification Search
CPC ........ H03H 11/22; H03H 11/02; H03H 11/12; H03H 11/0466; H03H 7/0138; H03H 7/06;

(Continued)

(56) References Cited

U.S. PATENT DOCUMENTS 6,987,966 B1 * 1/2006 Wu ............... H03B 21/01
375/147
10,491,198 B1 * 11/2019 Dinc ................ H03K 5/02

(Continued)

FOREIGN PATENT DOCUMENTS

CN          103326693 A      9/2013
CN          103326693 B      5/2016

OTHER PUBLICATIONS

Behbahani F., et al., "A Fully Integrated Low-IF CMOS GPS Radio With On-Chip Analog Image Rejection", IEEE Journal of Solid-State Circuits, vol. 37, No. 12, Dec. 2002, 7 Pages.

(Continued)

*Primary Examiner* — John W Poos
(74) *Attorney, Agent, or Firm* — Colby Nipper/Qualcomm

(57) ABSTRACT

An example apparatus includes a polyphase transconductance-capacitor filter. The polyphase filter includes a DC bias voltage node, a plus in-phase filter unit, a minus in-phase filter unit, a plus quadrature-phase filter unit, and a minus quadrature-phase filter unit. Each filter unit respectively includes an input node, an output node, and a control node. The polyphase filter also includes a plus in-phase switch and a minus in-phase switch. The plus in-phase switch is coupled to the control node of the plus in-phase filter unit, the DC bias voltage node, and the input node of one or both of the plus quadrature-phase filter unit and the minus quadrature-phase filter unit. The minus in-phase switch is coupled to the control node of the minus in-phase filter unit, the DC bias voltage node, and the input node of one or both of the plus quadrature-phase filter unit and the minus quadrature-phase filter unit.

30 Claims, 13 Drawing Sheets

(58) Field of Classification Search
CPC . H03H 7/21; H03H 2011/0494; H04W 12/02; H04W 12/03; H04W 12/04; H04W 12/06; H04W 12/08; H04W 12/069; H04W 12/71; H04W 88/06
See application file for complete search history.

(56) References Cited

U.S. PATENT DOCUMENTS

| | | |
|---|---|---|
| 2008/0201396 A1 | 8/2008 | Kudo |
| 2013/0202066 A1 | 8/2013 | Alzaher |
| 2014/0176259 A1* | 6/2014 | Reynaert ............... H03H 7/06 333/172 |
| 2015/0180523 A1 | 6/2015 | Tasic et al. |
| 2015/0280680 A1* | 10/2015 | Reynaert ............... H03H 7/21 333/172 |
| 2019/0028087 A1* | 1/2019 | Zhuo .................... H03D 1/04 |
| 2019/0097608 A1* | 3/2019 | Gathman ............ H03H 11/42 |

OTHER PUBLICATIONS

Hintea S., et al., "On the Design of a Reconfigurable OTA-C Filter for Software Radio", Adaptive Hardware and Systems, 2007, AHS 2007, Second NASA/ESA Conference on Adaptive Hardware and Systems, IEEE, Piscataway, NJ, USA, Aug. 5, 2007 (Aug. 5, 2007), pp. 541-546, XP031464209, ISBN: 978-0-7695-2866-3, 3. Reconfigurable OTA-C state variable "leap-frog" filters, p. 543, left-hand col.—p. 545, right-hand col. figures 2—9, abstract Sections 1 and 2.

Partial International Search Report—PCT/US2022/070803—ISA/EPO—Jun. 8, 2022.

Xu Y., et al., "Power-Scalable, Complex Bandpass/Low-Pass Filter With I/Q Imbalance Calibration for a Multimode GNSS Receiver", IEEE Transactions on Circuits and Systems II: Express Briefs, IEEE, USA, vol. 59, No. 1, Jan. 1, 2012 (Jan. 1, 2012), pp. 30-34, XP011397564, ISSN: 1549-7747, DOI: 10.1109/TCSII.2011. 2177700 II. Filter Design, A. Filter Architecture, p. 31, left-hand col. figure 2.

International Search Report and Written Opinion—PCT/US2022/070803—ISA/EPO—dated Aug. 8, 2022, 24 pages.

* cited by examiner

POLYPHASE FILTER WITH INTERPHASE COUPLING

TECHNICAL FIELD

This disclosure relates generally to wireless communication using an electronic device and, more specifically, to a polyphase filter.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, robotics, automotive electronics, thermostats and other sensors or automated controllers, devices embedded in other machines like refrigerators and industrial tools, Internet of Things (IoT) devices, and so forth. These various electronic devices provide services relating to productivity, communication, social interaction, security, safety, remote management, entertainment, transportation, and information dissemination. Thus, electronic devices play crucial roles in many aspects of modern society.

Many of the services provided by electronic devices in today's interconnected world depend at least partly on electronic communications. Electronic communications include, for example, those exchanged between or among different electronic devices using wireless or wired signals that are transmitted over one or more networks, such as the Internet, a Wi-Fi network, or a cellular network. Electronic communications therefore include both wireless and wired transmissions and receptions. To make such electronic communications, an electronic device uses a transceiver, such as a wireless transceiver.

Electronic communications can therefore be realized by propagating signals between two wireless transceivers at two different electronic devices. For example, using a wireless transmitter, a smartphone can transmit a wireless signal to a base station of a cellular network over an air medium as part of an uplink communication to support mobile services. Using a wireless receiver, the smartphone can receive a wireless signal from the base station via the air medium as part of a downlink communication to enable the mobile services. With a smartphone, mobile services can include phone and video calls, social media interactions, messaging, watching movies, sharing videos, performing searches, acquiring map information or navigational instructions, finding friends, location-based services generally, transferring money, ordering a good or service like a car ride, and so forth.

To provide these and other types of services, electronic devices typically use a wireless transceiver to communicate wireless signals in accordance with some wireless standard. Examples of wireless standards include an IEEE 802.11b or 802.11g Wi-Fi standard and a 4th Generation (4G) cellular standard, all of which are used today with smartphones and other connected devices. However, efforts to enable faster wireless networks through the creation of newer wireless standards are ongoing. Next-generation cellular networks and new Wi-Fi networks, for example, offer significantly higher bandwidths, lower latencies, and access to additional electromagnetic spectrum. Taken together, this means that exciting new wireless services can be provided to users, such as self-driving vehicles, augmented reality (AR) and other mixed reality (MR) imaging, on-the-go 4K video streaming, ubiquitous sensors to keep people safe and to use natural resources more efficiently, real-time language translations, and so forth.

To make these new, faster wireless technologies more widely available, many wireless devices besides smart phones will be deployed, which is sometimes called the "Internet of Things" (IoT). Compared to today's use of wireless devices, tens of billions, and eventually trillions, of more devices are expected to be connected to the internet with the arrival of the Internet of Things. These IoT electronic devices may include small, inexpensive, and low-powered devices, like digital controllers, sensors, and tracking tags. Many IoT devices will have smaller batteries and may therefore need to be more power efficient than smartphones.

Further, to enable next-generation wireless technologies, 5th Generation (5G) cellular wireless devices, Wi-Fi 6 devices, and devices adhering to Licensed Assisted Access (LAA) schemes will each be communicating with signals that use wider frequency ranges that are located at higher frequencies of the electromagnetic (EM) spectrum as compared to those devices that operate in accordance with older wireless standards. For example, newer devices will be expected to provide channel bandwidths over 20 Megahertz (MHz) and to operate at millimeter wave (mmW) frequencies. These "mmW frequencies" can include frequencies between at least 24 and 300 Gigahertz (GHz), but other high-frequency signals can include those around 20 GHz and those as low as 3-6 GHz. A version of LAA that is promulgated by the 3rd Generation Partnership Project (3GPP), for example, operates in a 5 GHz band.

To accommodate these commercial expectations and surmount the associated technical hurdles, the components that enable electronic communications under these constraints will be expected to operate efficiently at higher frequencies. One component that facilitates electronic communication is the wireless interface device, which can include a transceiver and a radio-frequency front-end (RFFE) for communication using wireless signals. However, the wireless interface devices designed for electronic devices that operate in accordance with existing Wi-Fi and 4G cellular standards are not adequate for the faster Wi-Fi 6, LAA, and 5G-capable devices of tomorrow. Newer electronic devices will confront higher frequencies, more-stringent latency requirements, wider channel bandwidth demands, and tighter fiscal constraints.

Consequently, to facilitate the adoption of newer and faster wireless technologies, as well as the widespread deployment of wireless interface devices that can provide new capabilities and services, new wireless interface devices will be developed. These new wireless interface devices will need to handle at least wider channel bandwidths, for example those that may be associated with higher frequency communication signals. Electrical engineers and other designers of electronic devices are therefore striving to develop new wireless interface devices that will enable the promise of Wi-Fi 6, LAA, 5G, and other higher-bandwidth (and higher-frequency) technologies to become a reality.

SUMMARY

A wireless signal is propagated between two electronic devices on a carrier. A single carrier can have a particular frequency bandwidth, such as 20 MHz for older wireless standards and 30 MHz or more for newer wireless standards. Communication bandwidth for a single carrier may therefore be constrained. To increase a total amount of wireless bandwidth that is provided to an electronic device, the electronic device can communicate using multiple carriers. Two or more carriers may be combined to increase bandwidth, for example pursuant to carrier aggregation as described in one or more (e.g., LTE or 5G) standards. For example, a single stream of data may be transmitted over multiple carriers using carrier aggregation, e.g., as opposed to separate carriers being used for respective data streams. Thus, carrier aggregation with two or more carriers can be used to increase a communication bandwidth provided to an electronic device.

If, e.g., two carriers are adjacent along the electromagnetic (EM) spectrum, both of the carriers can be processed by a single communication chain (e.g., by a transmit chain or by a receive chain) of a wireless interface device. This frequency adjacency is termed contiguous carrier aggregation (CCA). In some environments, however, two carriers assigned to a given electronic device may not be contiguous. This can happen, for instance, if a cellular service provider is licensed two frequency bands that are separated by a frequency band that belongs to another cellular service provider. In these circumstances, noncontiguous carrier aggregation (NCCA) may be implemented to increase total bandwidth.

Unfortunately, with NCCA a single communication chain may not be able to process both carriers, especially as the two carriers become separated by increasingly wider frequency ranges, which may overburden a baseband filter and analog-to-digital converter (ADC) with excessively high bandwidth and sample rate. When separate communication chains must be used to process the noncontiguous carriers, power usage increases, which shortens battery life for mobile electronic devices. Further, planning for these scenarios involves incorporating additional communication chains into the electronic device during manufacturing. These additional communication chains increase both the size and the cost of the device.

A pair of polyphase filters (e.g., polyphase transconductance-capacitor filters) can, however, be used to process two separate carriers that are nonadjacent. If a polyphase filter is configured to cross-couple signal components having different phases (e.g., an in-phase signal component and a quadrature-phase signal component), the polyphase filter can shift a frequency of a filtered signal from a "center" frequency provided by a local oscillator frequency of a local oscillator signal. If two polyphase filters are configured in this manner, a first polyphase filter can process a first carrier that is positively frequency-shifted above the local oscillator frequency, and a second polyphase filter can process a second carrier that is negatively frequency-shifted below the local oscillator frequency. Thus, two noncontiguous carriers that are aggregated can be processed by two polyphase filters. Although two polyphase filters are used, other components of a communication chain may be omitted or turned off. Example components that are obviated include, for a receive chain implementation, a low-noise amplifier and a local oscillator. Turning these components off can save power, and omitting them from a wireless interface device can further reduce a size and cost of the electronic device.

Enabling this frequency-shifting with a polyphase filter entails interphase coupling between, e.g., two phases of a signal. Unfortunately, cross-coupling two signal phase components having different phases within a polyphase filter is challenging. A polyphase transconductance-capacitor filter (or polyphase Gm-C filter) can be built using, for example, multiple transconductance-capacitor filters. Transconductance-capacitor (Gm-C) filters have topologies that can handle higher frequencies; thus, such Gm-C filters may be employed in high-bandwidth communication systems. Each respective transconductance-capacitor filter can include at least one transconductance unit (Gm unit). A respective chain of transconductance-capacitor filters processes each respective signal component having a different phase. To cross-couple the different phases, which enables the frequency-shifting, additional transconductance units are used to link the two chains of transconductance-capacitor filters. For instance, two additional transconductance units may be employed to cross-couple signal phase components for each filter stage of a polyphase transconductance-capacitor filter. With five stages to establish five poles for a polyphase filter, ten additional transconductance units are therefore employed. Each transconductance unit consumes some area of a wireless interface device, which drives up the cost and increases the size thereof. During operation, each transconductance unit also consumes power. Further, each transconductance unit degrades the noise and linearity performance of the polyphase filter.

It would therefore be advantageous to use a polyphase transconductance-capacitor filter to, for instance, implement NCCA to increase a total bandwidth provided to an electronic device while also saving power and both lowering cost and reducing a size of the wireless interface device and thus of the electronic device. A polyphase transconductance-capacitor filter can include multiple filter stages that each process at least two signal phase components. Each filter stage can include multiple filter units. In some implementations, current that represents a signal component is "reused" as part of a technique to cross-couple signal components of different phases. To do so, a switch can couple a second signal phase component to a filter unit of a filter stage that is processing a first signal phase component.

This enables the second signal phase component to affect the current that is representative of the first signal phase component within the filter unit. For example, the second signal phase component can be coupled to a current source of the filter unit to change (e.g., to increase or decrease) a magnitude of the current being contributed by the current source. Additionally or alternatively, the second signal phase component can be coupled to a transistor that forms a part of the current source via a gate terminal of the transistor. In these manners, signal components of different phases can be cross-coupled at one or more filter stages along a polyphase filter and obviate the use of cross-coupling transconductance units.

In an example aspect, an apparatus for filtering a signal is disclosed. The apparatus includes a polyphase filter that can be implemented as a polyphase transconductance-capacitor (Gm-C) filter. In addition to a direct-current (DC) bias voltage node, the polyphase Gm-C filter includes a plus in-phase filter unit having an input node, an output node, and a control node. The polyphase Gm-C filter also includes a minus in-phase filter unit having an input node, an output node, and a control node. The polyphase Gm-C filter further includes a plus quadrature-phase filter unit having an input node, an output node, and a control node. The polyphase Gm-C filter also includes a minus quadrature-phase filter unit having an input node, an output node, and a control node. The polyphase Gm-C filter additionally includes a plus in-phase switch coupled to the control node of the plus in-phase filter unit, the DC bias voltage node, and one or both of the input node of the plus quadrature-phase filter unit and the input node of the minus quadrature-phase filter unit. The polyphase Gm-C filter further includes a minus in-phase switch coupled to the control node of the minus in-phase filter unit, the DC bias voltage node, and one or both of the input node of the plus quadrature-phase filter unit and the input node of the minus quadrature-phase filter unit.

In an example aspect, an apparatus for filtering a signal is disclosed. The apparatus includes a polyphase filter that can be implemented as a polyphase transconductance-capacitor (Gm-C) filter. The polyphase Gm-C filter includes plus in-phase means for filtering plus in-phase signal components, with the plus in-phase means including a control node, and minus in-phase means for filtering minus in-phase signal components, with the minus in-phase means including a control node. The polyphase Gm-C filter also includes plus quadrature-phase means for filtering plus quadrature-phase signal components, with the plus quadrature-phase means including a control node, and minus quadrature-phase means for filtering minus quadrature-phase signal components, with the minus quadrature-phase means including a control node. The polyphase Gm-C filter additionally includes plus in-phase means for switching a plus in-phase control signal to the control node of the plus in-phase means for filtering using the plus quadrature-phase means for filtering or the minus quadrature-phase means for filtering. The polyphase Gm-C filter further includes minus in-phase means for switching a minus in-phase control signal to the control node of the minus in-phase means for filtering using the plus quadrature-phase means for filtering or the minus quadrature-phase means for filtering. The polyphase Gm-C filter may further include plus quadrature-phase means for switching a plus quadrature-phase control signal to the control node of the plus quadrature-phase means for filtering using the plus in-phase means for filtering or the minus in-phase means for filtering, and minus quadrature-phase means for switching a minus quadrature-phase control signal to the control node of the minus quadrature-phase means for filtering using the plus in-phase means for filtering or the minus in-phase means for filtering. The apparatus may further include control means for engaging the polyphase filter into a filter mode of multiple filter modes. The multiple filter modes may include at least one frequency-shift filter mode.

In an example aspect, a method for operating a polyphase filter as a polyphase transconductance-capacitor (Gm-C) filter is disclosed. The method includes propagating a plus in-phase signal component through a plus in-phase filter unit that includes a control transistor and propagating a minus in-phase signal component through a minus in-phase filter unit that includes a control transistor. The method also includes propagating a plus quadrature-phase signal component through a plus quadrature-phase filter unit that includes a control transistor and propagating a minus quadrature-phase signal component through a minus quadrature-phase filter unit that includes a control transistor. The method additionally includes selectively coupling the plus quadrature-phase signal component or the minus quadrature-phase signal component to a control terminal of the control transistor of the plus in-phase filter unit. The method further includes selectively coupling the plus quadrature-phase signal component or the minus quadrature-phase signal component to a control terminal of the control transistor of the minus in-phase filter unit.

In an example aspect, a filter is disclosed. The apparatus includes a first filter unit and a second filter unit. The first filter unit includes a first input node, a first output node, a first capacitor coupled between the first input node and ground, a first current source coupled to the first input node, and a first transconductor coupled between the first current source and the first output node. The first input node is coupled to a first mixer configured to provide a first phase signal component. The first current source includes a transistor having a drain coupled to the first transconductor, a source coupled to a power distribution network node, and a gate. The second filter unit includes a second input node, a second output node, a second capacitor coupled between the second input node and ground, a second current source coupled to the second input node, and a second transconductor coupled between the second current source and the second output node. The second input node is coupled to a second mixer configured to provide a second phase signal component. The apparatus further includes means for selectively coupling the gate of the transistor to the second input node and for selectively coupling the gate of the transistor to a bias.

BRIEF DESCRIPTION OF DRAWINGS

FIG. 3-1 illustrates an example transconductance-capacitor filter having at least one Gm unit and a graph having an example associated frequency response.

FIG. 3-2 illustrates an example polyphase transconductance-capacitor filter having multiple Gm units, including coupling Gm units, and a graph having an example partial associated frequency response.

FIGS. 8-1 and 8-2 are circuit diagrams illustrating portions of an example filter stage of a polyphase filter that includes multiple filter units for differential signals having multiple phase components.

DETAILED DESCRIPTION

Figure 1:
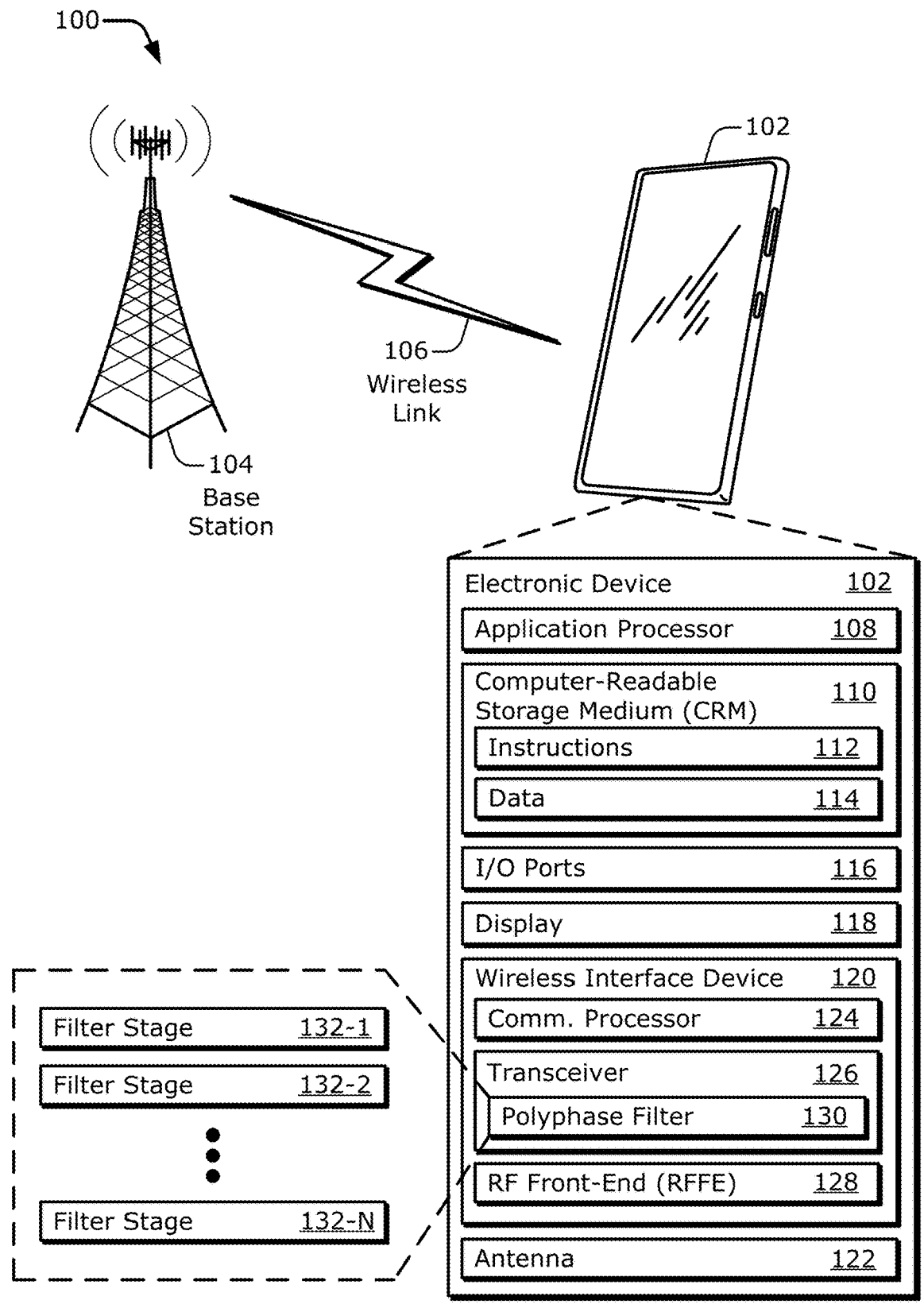
FIG. 1 illustrates an environment with an example electronic device including a wireless interface device, which includes a transceiver having a polyphase filter, which may be implemented as a polyphase transconductance-capacitor (Gm-C) filter with multiple filter stages.

The developing wireless standards for Wi-Fi 6 networks and for Licensed Assisted Access (LAA) and 5G wireless communications are intended to establish broadband capabilities at higher frequencies in the gigahertz (GHz) range. This can include wireless communications that provide broader channel bandwidths using frequencies of more than 3 GHz. To facilitate wireless communications at higher bandwidths, some electronic devices employ carrier aggregation. Due to a desire to utilize the available frequency spectrum or because of frequency-licensing constraints, some wireless electronic devices employ noncontiguous carrier aggregation (NCCA). For example, a particular cellular service provider may have rights to two frequency bands that are separated by another frequency band that belongs to a different cellular service provider. To address such situations, NCCA involves combining carriers that are not adjacent to one another on the electromagnetic (EM) frequency spectrum to obtain a wider total bandwidth for a given electronic device.

Generally, if two frequency bands are nonadjacent, an electronic device uses two complete communication chains to process signals for the two frequency bands. In this context, a communication chain corresponds to a transmit chain or a receive chain and respectively includes components for processing a signal for transmission from an antenna or for processing a signal that has been received by an antenna. In certain situations, however, at least part of one communication chain of two communication chains can be unused while two signals are still processed. This can provide power savings or a lower component footprint, including possibly both benefits.

In an example signal-receiving environment, a receive chain includes a low-noise amplifier, at least one mixer for frequency down-conversion, and a local oscillator to provide a local oscillator signal to the mixer. The receive chain also includes at least one filter to "focus" a received signal on a frequency band of interest by attenuating other frequency ranges. Typically, for NCCA a full receive chain is used to process each signal of two signals that respectively correspond to two nonadjacent frequency bands. Employing a polyphase filter, on the other hand, can obviate some of the components of the two receive chains.

In operation, a polyphase filter filters a signal using at least two phase components of the signal, such as an in-phase signal component and a quadrature-phase signal component. In these cases, the in-phase signal component and the quadrature-phase signal component can be separated by ninety degrees (90°). The polyphase filter can also utilize interphase cross-coupling between the two signal phase components to shift a frequency band that is output by the filter. With two such polyphase filters, one polyphase filter provides a positive frequency shift above a local oscillator signal, and another polyphase filter provides a negative frequency shift below the local oscillator signal. Thus, two polyphase filters can output two received signals at two different frequency bands, even nonadjacent frequency bands, to thereby process NCCA signals.

Although two polyphase filters are used to process two signals for two noncontiguous frequency bands, other components of a receive chain may be omitted from the hardware to save costs and area or may be omitted from contemporaneous functioning to save power. These advantages can be achieved because each polyphase filter can shift a targeted frequency band away from a "center" frequency of a common local oscillator signal. The local oscillator signal, which has a local oscillator frequency, is supplied to both mixers. Signals that are fed to the two polyphase filters can be split from the mixers. Thus, the existence or contemporaneous operation of components that are disposed "before" the mixers along the receive chain can be avoided. For example, the low-noise amplifier and a separate frequency synthesizer for the local oscillator signal can be powered down or omitted.

Two polyphase filters can therefore filter signals for two noncontiguous frequency bands without relying on two full communication chains. In some environments, a polyphase transconductance-capacitor (Gm-C) filter is constructed using transconductance-capacitor filters that are arranged into two chains. A first chain of transconductance-capacitor filters processes an in-phase signal component, and a second chain of transconductance-capacitor filters processes a quadrature-phase signal component. Each chain can operate independently such that the polyphase transconductance-capacitor filter implements a lowpass filter. To implement a frequency-shift filter (e.g., a complex bandpass filter), on the other hand, the in-phase signal components and the quadrature-phase signal components are cross-coupled as each traverses a respective chain of transconductance-capacitor filters. To do so, a pair of transconductance units can be deployed at each cross-coupling point along the two chains of transconductance-capacitor filters to enable interphase cross-coupling. Examples of this approach to realizing a polyphase transconductance-capacitor filter are described below with reference to FIGS. 3-1 and 3-2.

This pair of transconductance units for the interphase cross-coupling, however, occupies space and utilizes current during operation. Consequently, each pair of transconductance units increases both device cost and power usage. Further, a pair of transconductance units may be deployed at each stage of a multi-stage filter to provide higher-order filtering performance. The negative cost and power effects for each pair of transconductance units are therefore multiplied by the number of poles in the filter. Additionally, these transconductance units may degrade linearity and noise performance of the polyphase transconductance-capacitor filter.

In contrast, in example implementations that are described herein, a polyphase transconductance-capacitor (Gm-C) filter may include multiple filter stages to provide multiple filter poles. Each filter stage includes multiple filter units. For a differential two-phase implementation, each filter stage can include four filter units: a plus in-phase filter unit, a minus in-phase filter unit, a plus quadrature-phase filter unit, and a minus quadrature-phase filter unit. Each filter unit includes a transconductance unit having at least three components coupled together in series between two power distribution nodes: a first current source, a transconductor, and a second current source.

For each filter unit, a respective switch is coupled to two other phase signal components and/or filter units of different phase components. For example, a control node of the plus in-phase filter unit can be selectively coupled to the plus quadrature-phase signal component and the minus quadrature-phase signal component, and/or the filter units thereof. To "reuse" the current flowing through the three components that are coupled together in series, the second current source is realized as a control transistor that can be controlled at least partially by coupling to a quadrature-phase signal component. For instance, the control node of the plus in-phase filter unit can be implemented as a control terminal of the control transistor (e.g., as a gate terminal of a field-effect transistor (FET)) that implements the second current source. Thus, the switch can be coupled between the gate terminal and both the plus quadrature-phase signal component and the minus quadrature-phase signal component without an additional pair of intervening transconductance units.

In some implementations, with cross-coupling to the plus quadrature-phase signal component, the polyphase filter can operate to frequency-shift the frequency band positively. With cross-coupling to the minus quadrature-phase signal component, the polyphase filter can operate to frequency-shift the frequency band negatively. Further, the polyphase filter can also be selectively operated as a lowpass filter. To do so, the switch couples the gate terminal of the control transistor to a direct-current (DC) bias voltage. In these manners, a polyphase transconductance-capacitor filter can be employed that enables frequency-shifted filtering while obviating usage of additional transconductance units for the interphase cross-coupling. This enables NCCA to be performed on two signals without necessarily using two full communication chains, which may involve running two frequency synthesizers and local oscillators.

FIG. 1 illustrates an example environment 100 with an example electronic device 102 including a wireless interface device 120. The wireless interface device 120 includes a transceiver 126 having a polyphase filter 130, which may have multiple filter stages 132-1, 132-2, . . . , 132-N, with "N" representing a positive integer. In the environment 100, the example electronic device 102 communicates with a base station 104 through a wireless link 106. In FIG. 1, the electronic device 102 is depicted as a smartphone. The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, be, ac, ax, ad, aj, or ay (e.g., Wi-Fi 6 or WiGig®); an IEEE 802.16 standard (e.g., WiMAX™); a Bluetooth™ standard; and so forth. In some implementations, the wireless link 106 may provide power wirelessly, and the electronic device 102 or the base station 104 may comprise a power source or power sink.

As shown, the electronic device 102 may include one or more application processors 108 and one or more computer-readable storage mediums 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), nonvolatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques as described herein.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). The frequency translation can be accomplished using a mixer (not shown in FIG. 1). Generally, the transceiver 126 includes filters, switches, amplifiers, mixers, and so forth for routing and conditioning signals that are transmitted or received via the antenna 122.

As shown, the transceiver 126 includes at least one polyphase filter 130. Nonetheless, the transceiver 126 can include other components, such as an analog-to-digital converter (ADC) or a digital-to-analog converter (DAC). In operation, an ADC can convert from analog signals to digital signals, and a DAC can convert from digital signals to analog signals. An ADC or a DAC can be implemented as part of the communication processor 124, as part of the transceiver 126, or separately from both of them (e.g., as another part of an SoC or as part of the application processor 108).

Figure 2:
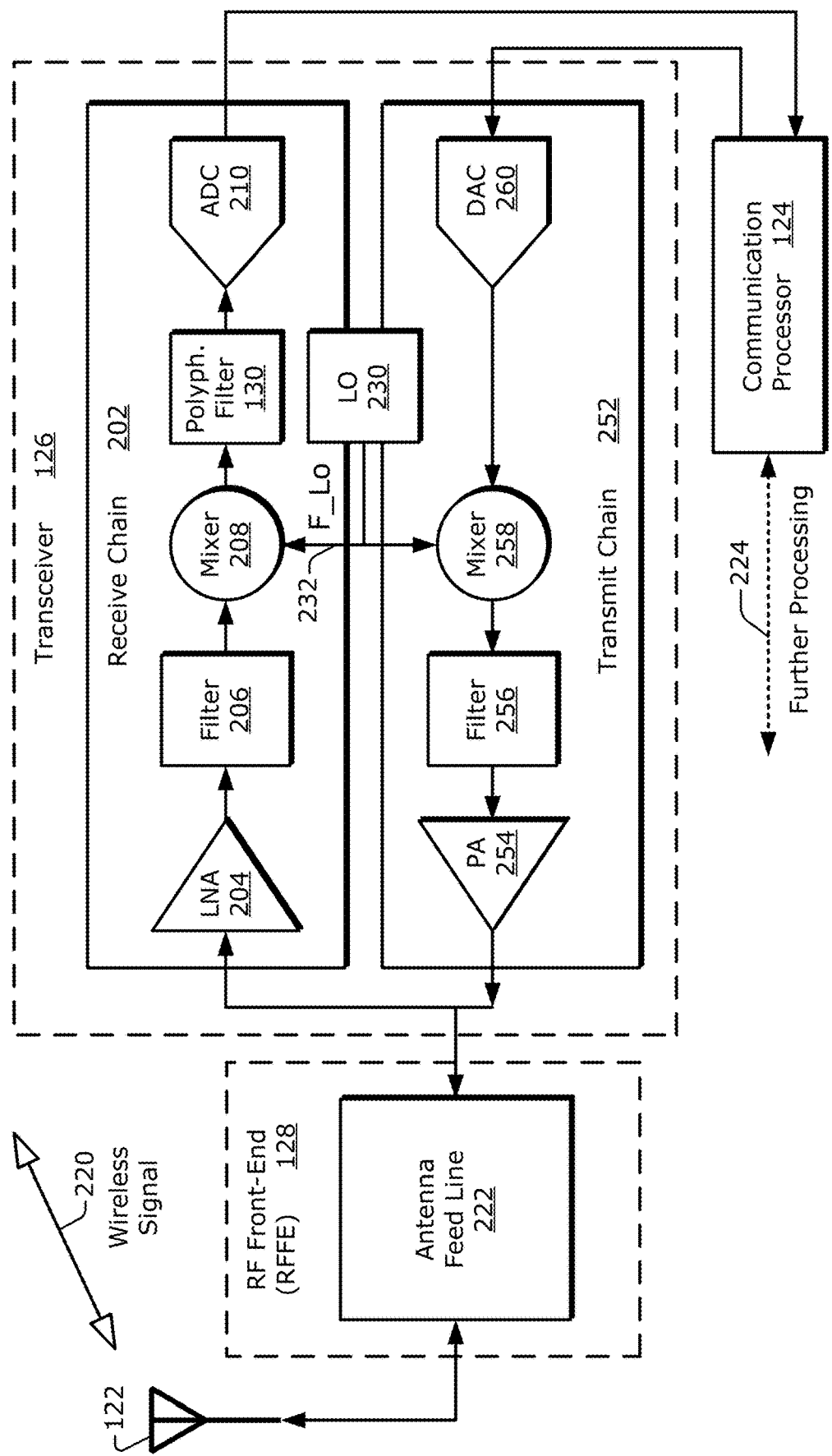
FIG. 2 illustrates an example transceiver having a receive chain including a polyphase filter that can implement interphase coupling across one or more filter stages.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, the polyphase filter 130 is depicted as being part of a transceiver 126. Described implementations of a polyphase filter 130 can, however, additionally or alternatively be employed in other portions of the wireless interface device 120 (e.g., as part of the communication processor 124 or the RF front-end 128) or in other portions of the electronic device 102 generally. In example implementations, the polyphase filter 130 includes multiple filter stages 132-1, 132-2, ..., 132-N, with "N" representing a positive integer greater than one (e.g., two or more). A polyphase filter 130 may, however, comprise a single filter stage 132. As described herein, the polyphase filter 130 may be implemented as a polyphase transconductance-capacitor (Gm-C) filter. Additional aspects of the wireless interface device 120, including with regard to the polyphase filter 130, are described below with reference to FIG. 2.

FIG. 2 illustrates, at 200 generally, an example transceiver 126 that includes a polyphase filter 130 that can implement interphase coupling across one or more filter stages (not shown in FIG. 2) to support a plurality of (e.g., frequency-shifted) filter modes. FIG. 2 further depicts the antenna 122, the RF front-end 128, and the communication processor 124. As illustrated from left to right, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are explicitly shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 may include other unillustrated components, more or fewer components, differently-coupled arrangements of components, and so forth.

In some implementations, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 or another component of the RF front-end 128 conditions the propagating signal. This may enable the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, a phase shifter, and so forth.

In some implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, the polyphase filter 130, and an ADC 210. From left-to-right, the transmit chain 252 includes a power amplifier 254 (PA 254), a filter 256, a mixer 258 for frequency up-conversion, and a DAC 260. However, the receive chain 202 or the transmit chain 252 can include other components—such as additional amplifiers or filters, multiple mixers, or one or more buffers—that are electrically disposed anywhere along the depicted receive and transmit chains.

The receive chain 202 is coupled between the antenna feed line 222 of the RF front-end 128 and the communication processor 124, e.g., via the low-noise amplifier 204 and the ADC 210, respectively. The transmit chain 252 is coupled between the antenna feed line 222 and the communication processor 124, e.g., via the power amplifier 254 and the DAC 260, respectively. As depicted in FIG. 2, the transceiver 126 can also include at least one local oscillator 230 (LO 230). For example, each transmit chain/receive chain pair may share a local oscillator 230. Alternatively, the transceiver 126 may include at least one local oscillator 230 per transmit chain and at least one local oscillator 230 per receive chain. The local oscillator 230 produces a local oscillator signal 232 having a local oscillator frequency (F_Lo). The local oscillator 230 can include or be associated with a crystal oscillator, a phase-locked loop, and so forth.

As shown for the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the polyphase filter 130. The polyphase filter 130 is coupled to the ADC 210. The ADC 210 is in turn coupled to the communication processor 124. As shown for the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

An example signal-receiving operation that includes the receive chain 202 of the transceiver 126 is now described. As part of the signal-receiving operation, the antenna 122 receives a wireless signal 220. The antenna 122 can be implemented as an individual antenna, as an antenna array, as an antenna element of an antenna array, and so forth. The antenna 122 provides the received signal 220 to the RF front-end 128, and the RF front-end 128 uses the antenna feed line 222 to forward the corresponding wired signal to the transceiver 126. Thus, the antenna 122 provides the wireless signal 220 to the low-noise amplifier 204 of the receive chain 202 after conditioning or other signal manipulation by the antenna feed line 222. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the mixer 208.

Figure 3:
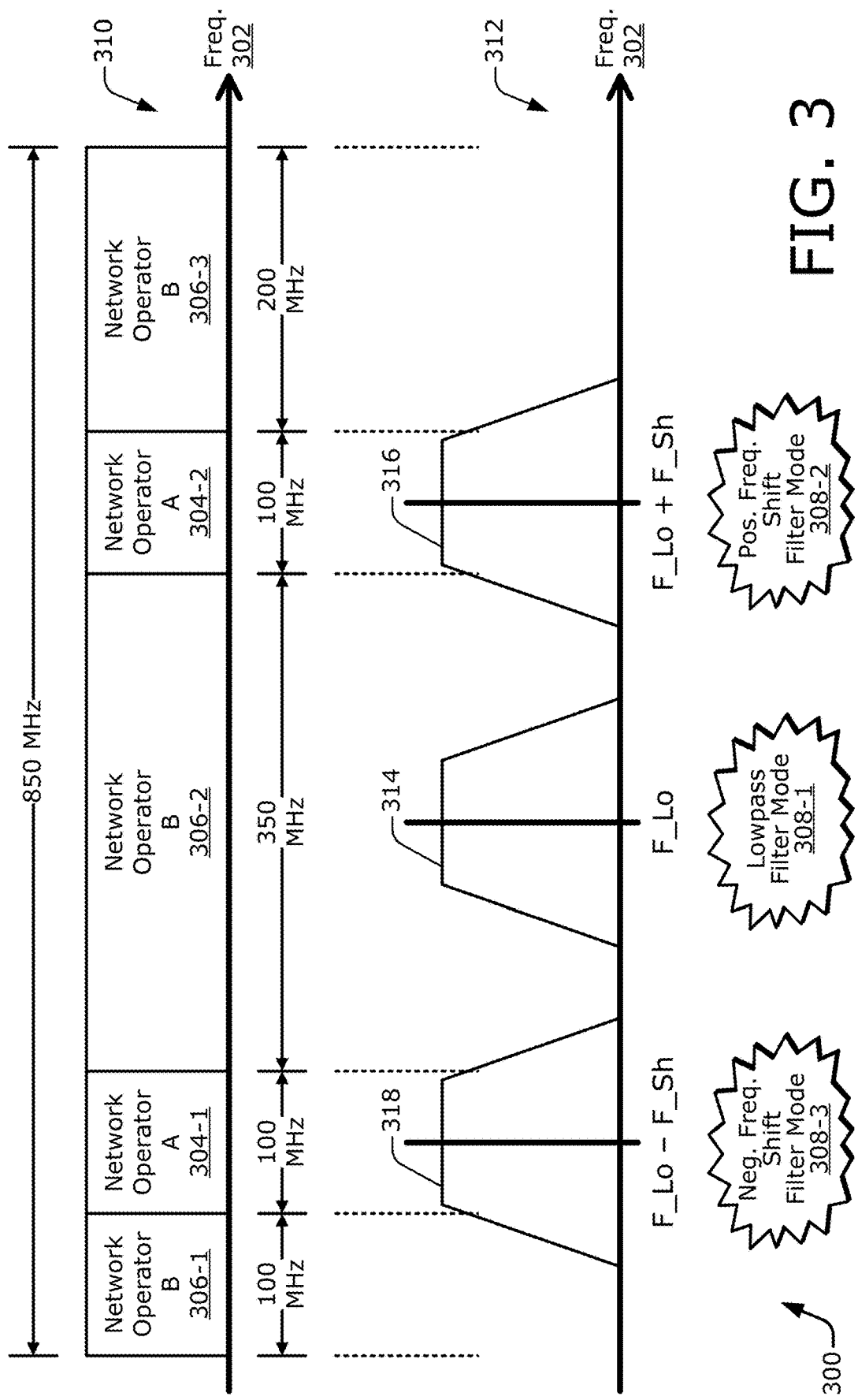
FIG. 3 illustrates a frequency allocation chart and a corresponding set of example filter modes that can be implemented by a polyphase filter with interphase coupling.
Figures 1, 3:
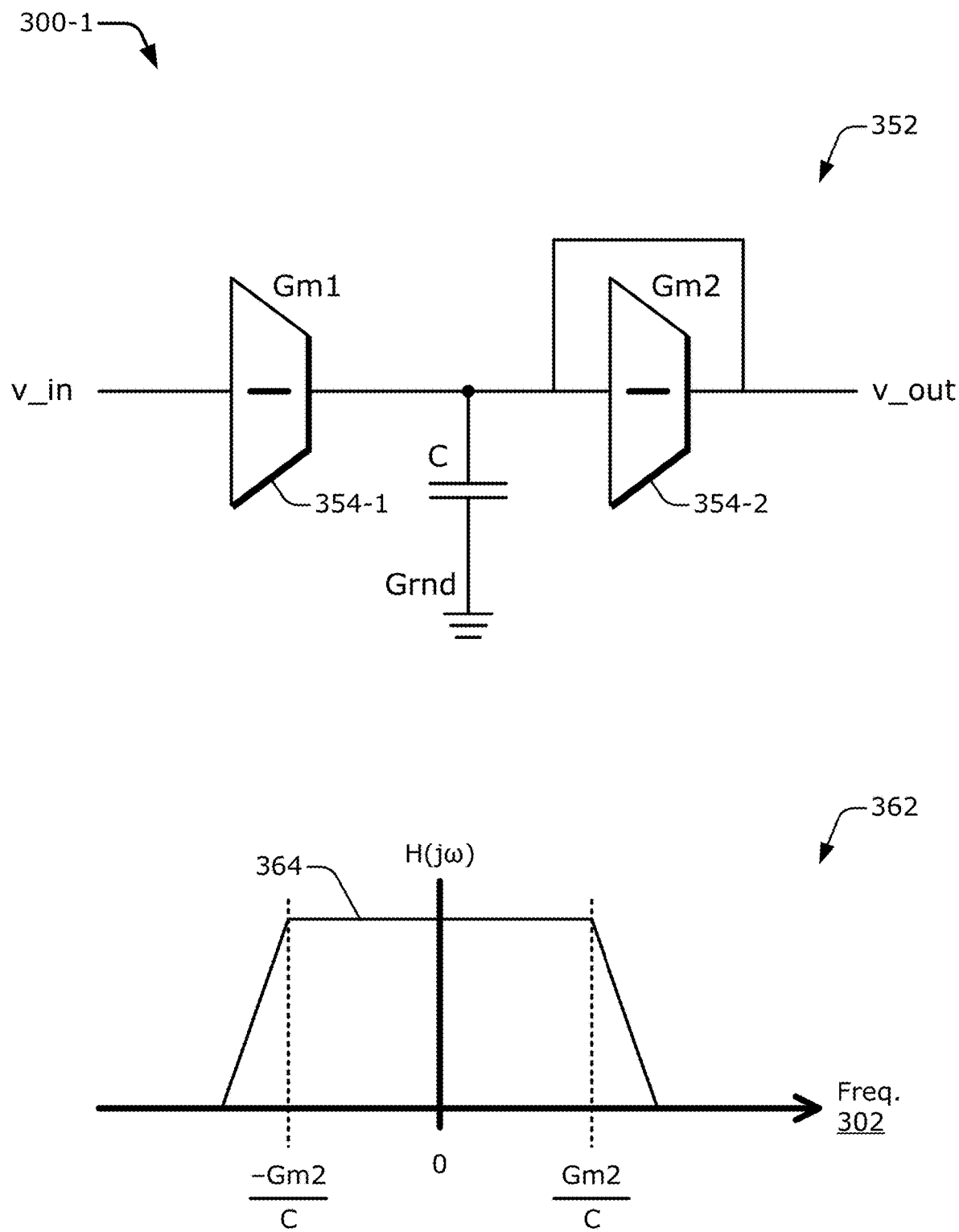
Figure 3:
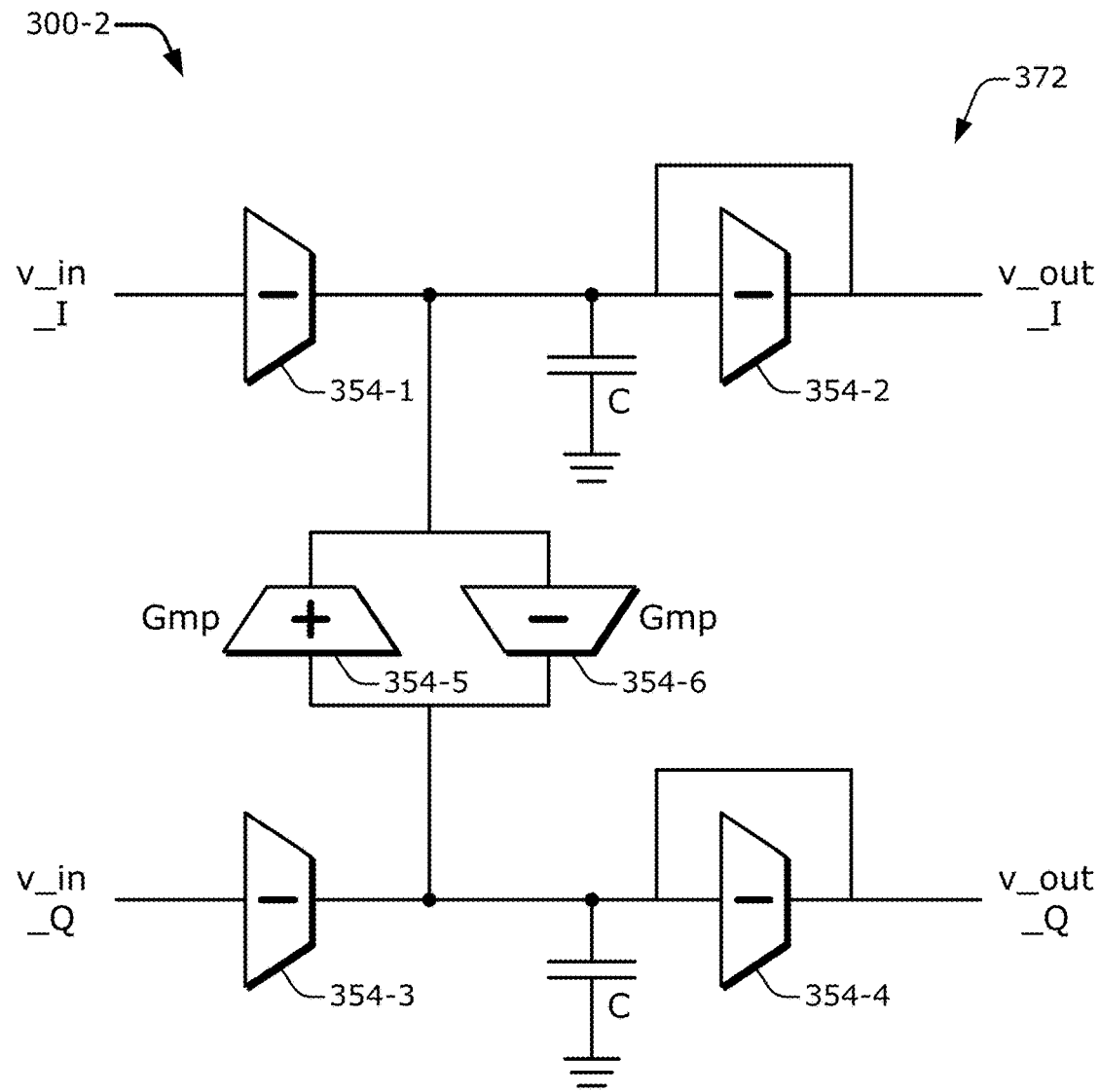
Figure 2:
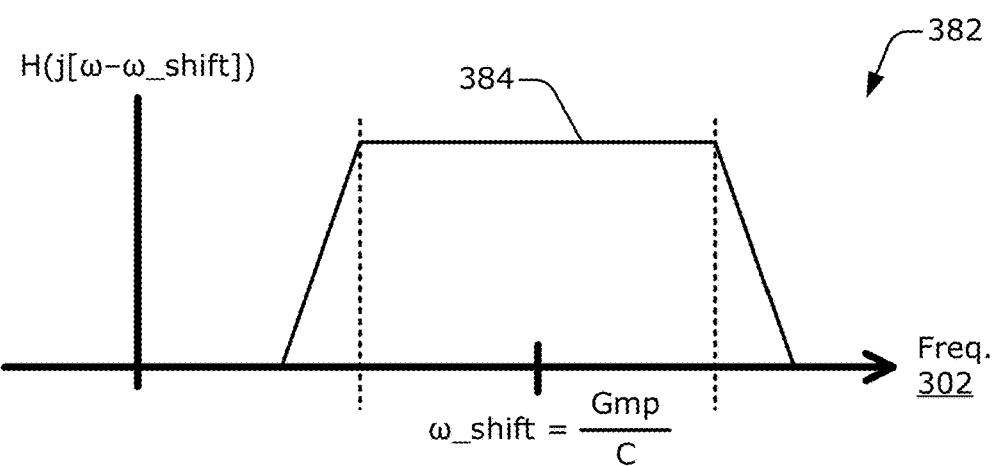

The mixer 208 performs a frequency conversion operation on the filtered signal to down-convert from one frequency to a lower frequency, such as from a radio frequency (RF) to an intermediate frequency (IF) or to a baseband frequency (BB). The mixer 208, or multiple such mixers as shown in FIG. 3, can perform the frequency down-conversion in a single conversion step, or through multiple conversion steps, using at least one local oscillator 230 that generates a local oscillator signal 232 having a local oscillator frequency. Thus, the mixer 208 accepts the filtered signal and performs a frequency down-conversion operation on the filtered signal to produce a down-converted signal; the mixer 208 also provides the down-converted signal to the polyphase filter 130.

The polyphase filter 130 performs at least one filtering operation on the down-converted signal as described herein to produce a filtered signal. As is apparent from this description of FIG. 2, the filter 130 may be configured as a baseband filter configured to process a receive signal. The polyphase filter 130 passes the filtered (receive) signal to the ADC 210, and the ADC 210 converts the analog filtered signal to a digital signal. The ADC 210 provides the digital signal to the communication processor 124. The communication processor 124 can perform demodulation, decoding, and so forth on the digital signal to produce a data signal. The communication processor 124 then provides the data signal to other components, such as the application processor 108 (of FIG. 1), for further processing at 224 (e.g., for processing at an application level).

As part of an example signal-transmitting operation that includes the transmit chain 252, the DAC 260 accepts a digital signal from the communication processor 124. While the ADC 210 and the DAC 260 are illustrated as being separately coupled to the processor 124, they may share a bus or other means for communicating with the processor 124. The DAC 260 converts the digital signal to an analog signal, which is at a baseband frequency (BB) or an intermediate frequency (IF). The mixer 258 accepts the analog signal from the DAC 260. The mixer 258 upconverts the analog signal to a higher frequency, such as an RF frequency, to produce an RF signal using the local oscillator signal 232 that is provided by the local oscillator 230 to have the local oscillator frequency (F_Lo). The mixer 258 provides the RF signal to the filter 256. The filter 256 filters the RF signal to attenuate one or more frequency ranges and produces a filtered signal, which the filter 256 provides to the power amplifier 254. The power amplifier 254 amplifies the filtered signal to generate an amplified signal. The power amplifier 254 provides the amplified signal to the antenna feed line 222 for signal conditioning. The RF front-end 128 uses the antenna feed line 222 to provide the conditioned signal to the antenna 122 for emanation as another wireless signal 220.

The polyphase filter 130 is depicted in FIG. 2 as being part of the receive chain 202 of the transceiver 126 to enable multiple filtering modes. Such filtering modes support NCCA in some embodiments. However, a polyphase filter 130 can be deployed in the transmit chain 252 or in other portions of an electronic device to be used for filtering signals of different frequency bands.

FIG. 3 illustrates, generally at 300, a frequency allocation chart 310 and a corresponding set of example filter modes that can be implemented by a polyphase filter with inter-phase coupling. A filter graph 312 and the frequency allocation chart 310 both include a frequency axis 302 in which frequency increases from left to right. By way of example, the frequency allocation chart 310 spans 850 Megahertz (MHz) and includes frequency allocations for two network operators: a network operator A and a network operator B. Network operator A is licensed two frequency allocations: a first frequency allocation 304-1 and a second frequency allocation 304-2. Network operator B has three frequency allocations: a first frequency allocation 306-1, a second frequency allocation 306-2, and a third frequency allocation 306-3.

As shown, the frequency allocations are located along the frequency axis 302 in the following order of increasing frequency: the first frequency allocation 306-1, the first frequency allocation 304-1, the second frequency allocation 306-2, the second frequency allocation 304-2, and the third frequency allocation 306-3. The first frequency allocation 306-1, the first frequency allocation 304-1, and the second frequency allocation 304-2 are each 100 MHz wide. The second frequency allocation 306-2 and the third frequency allocation 306-3 have bandwidths of 350 MHz and 200 MHz, respectively.

For this example, the network operator A has two frequency allocations (e.g., the first frequency allocation 304-1 and the second frequency allocation 304-2) that are separated by a frequency allocation of the network operator B (e.g., the second frequency allocation 306-2). The first frequency allocation 304-1 is nonadjacent to the second frequency allocation 304-2 of the network operator A. For subscribers of the network operator A to be able to aggregate carriers within the first and second frequency allocations 304-1 and 304-2, an electronic device can implement non-contiguous carrier aggregation (NCCA).

Example frequency bands that can be processed by three filter modes 308-1 to 308-3 of a polyphase filter 130 are shown with reference to the filter graph 312. A first frequency band 314 can be centered around a local oscillator frequency (F_Lo), such as one of a local oscillator signal 232 (of FIG. 2). This corresponds to a lowpass filter mode 308-1 of the polyphase filter 130. A second frequency band 316 can be centered around a frequency that results from increasing the local oscillator frequency (F_Lo) by a frequency-shift amount (F_Sh) to obtain a positive shifted frequency (F_Lo+F_Sh). This corresponds to a positive frequency-shift filter mode 308-2. A third frequency band 318 can be centered around a frequency that results from decreasing the local oscillator frequency (F_Lo) by the frequency-shift amount (F_Sh) to produce a negative shifted frequency (F_Lo−F_Sh). This corresponds to a negative frequency-shift filter mode 308-3 of the polyphase filter 130.

In example implementations, a first polyphase filter 130 with interphase coupling can be used to realize the positive frequency-shift filter mode 308-2. A second polyphase filter 130 with interphase coupling can be used to realize the negative frequency-shift filter mode 308-3. Advantageously, both polyphase filters can operate with a mixer that is translating frequencies using the same local oscillator frequency (F_Lo). This can save power or both save power and reduce a quantity of components included in a wireless transceiver while supporting NCCA for the network operator A. Further, each polyphase filter 130 can be used in the lowpass filter mode 308-1 at other times with a different local oscillator frequency that is not located within the frequency allocation of another network operator (e.g., that is not located within a frequency allocation licensed to network operator B) or with the illustrated local oscillator frequency when receiving communications for the other network operator.

FIG. 3-1 illustrates, at 300-1 generally, an example transconductance-capacitor filter 352 having at least one Gm unit 354. FIG. 3-1 also illustrates a graph 362 having an example associated frequency response 364. The illustrated transconductance-capacitor filter 352 (Gm-C filter 352) includes a first Gm unit 354-1 with a first transconductance (Gm1), a second Gm unit 354-2 with a second transconductance (Gm2), and a capacitor C. The first Gm unit 354-1 is coupled in series with the second Gm unit 354-2 between an input and an output of the transconductance-capacitor filter 352, which respectively correspond to an input voltage (v_in) and an output voltage (v_out). The capacitor C is coupled between a ground (Grnd) and a node that is positioned between an output of the first Gm unit 354-1 and an input of the second Gm unit 354-2.

In operation, the transconductance-capacitor filter 352 accepts an input voltage (v_in) and produces an output voltage (v_out). The first Gm unit 354-1 converts the input voltage (v_in) to a current. The second Gm unit 354-2, using a feedback loop that is coupled between an output and the input thereof, converts the current to the output voltage (v_out). The transfer function H(jω) of the transconductance-capacitor filter 352 can be represented by:

$$\frac{-Gm1}{Gm2} \cdot \frac{1}{1 + \frac{j\omega C}{Gm2}}$$

The graph 362 depicts the transfer function H(jω) versus the frequency 302. The graph 362 illustrates the frequency response 364 around the center frequency (0). The corner frequency ω_p can be determined from the second transconductance (Gm2) and the capacitance C of the capacitor C. Specifically, the corner frequency ω_p can be proportional to Gm2/C. This results in corner frequencies of −Gm2/C and +Gm2/C around the center frequency as shown. As is described next, this frequency response 364 can be shifted to a higher or a lower frequency using a polyphase transconductance-capacitor filter.

FIG. 3-2 illustrates, generally at 300-2, an example polyphase transconductance-capacitor filter 372 having multiple Gm units 354-1 to 354-6, including coupling Gm units 354-5 and 354-6. FIG. 3-2 also illustrates a graph 382 having an example partial associated frequency response 384. As shown, the polyphase transconductance-capacitor filter 372 (polyphase Gm-C filter 372) can be formed from two transconductance-capacitor filters 352 (of FIG. 3-1) and an interphase coupling portion including two Gm units 354-5 and 354-6. The polyphase transconductance-capacitor filter 372 filters and propagates two signal phase components: an in-phase (I) signal phase component and a quadrature-phase (Q) signal phase component.

An "upper" (as depicted)) transconductance-capacitor filter corresponds to the in-phase signal component. This in-phase transconductance-capacitor filter accepts as input an in-phase input voltage (v_in_I) and produces as output an in-phase output voltage (v_out_I). The in-phase transconductance-capacitor filter includes first and second Gm units 354-1 and 354-2. A "lower" transconductance-capacitor filter corresponds to the quadrature-phase signal component. This quadrature-phase transconductance-capacitor filter accepts as input a quadrature-phase input voltage (v_in_Q)

and produces as output a quadrature-phase output voltage (v_out_Q). The quadrature-phase transconductance-capacitor filter includes third and fourth Gm units 354-3 and 354-4.

The interphase coupling portion includes a fifth Gm unit 354-5 and a sixth Gm unit 354-6. The fifth and sixth Gm units 354-5 and 354-6 are coupled together in parallel between the outputs of the first and third Gm units 354-1 and 354-3. Each Gm unit of the fifth and sixth Gm units 354-5 and 354-6 have an interphase transconductance (Gmp). The interphase coupling portion enables frequency shifting of the output signal. The frequency shifting is proportional to the interphase transconductance (Gmp).

The graph 382 depicts the frequency-shifting transfer function $H(j[\omega-\omega\_shift])$ versus the frequency 302. The graph 382 illustrates the frequency response 384 that represents a positive frequency shift above the "core center frequency" of each individual transconductance-capacitor filter portion. The center frequency of the positively-shifted response is ω_shift away from the core center frequency. The frequency shift ω_shift can be determined from the interphase transconductance (Gmp) and the capacitance C of each capacitor C of each transconductance-capacitor filter portion. Specifically, the positively-shifted center frequency ω_shift can be proportional to Gmp/C, as shown for the frequency response 384. Although not shown, an analogous negatively-shifted frequency response can be generated with the negatively-shifted center frequency ω_shift being proportional to –Gmp/C.

The polyphase transconductance-capacitor filter 372 includes two Gm units (fifth and sixth Gm units 354-5 and 354-6) as part of the interphase portion between the in-phase (I) and quadrature-phase (Q) transconductance-capacitor filters. These two Gm units occupy space, consume power, and can negatively impact linearity. In contrast, example implementations that are described herein can provide a polyphase transconductance-capacitor filter that omits the two Gm units in the interphase portion of the illustrated polyphase transconductance-capacitor filter 372.

Figure 4:
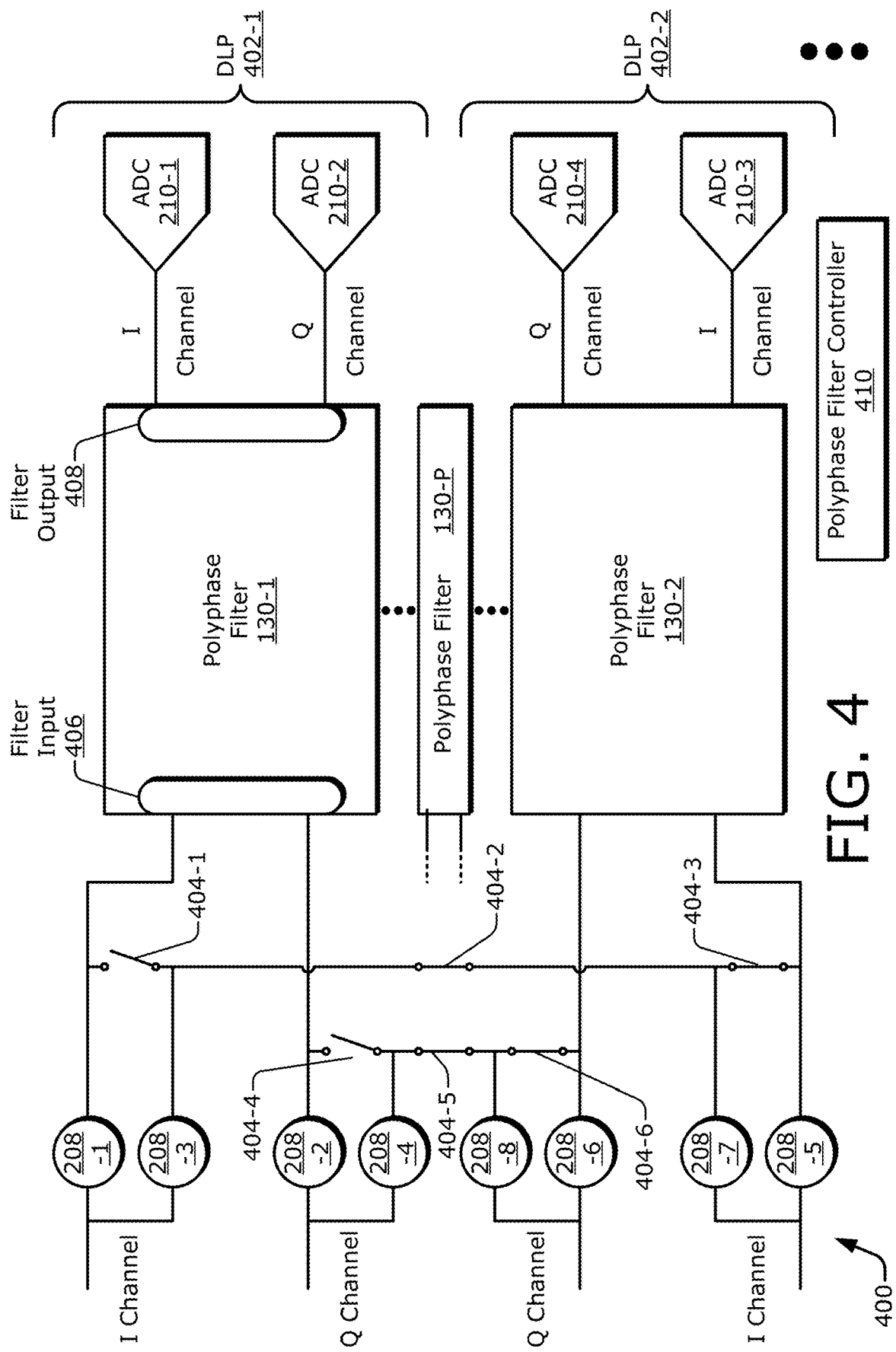
FIG. 4 illustrates an example portion of a receive chain that includes multiple mixers and multiple polyphase filters, each of which may be implemented as a polyphase transconductance-capacitor (Gm-C) filter.

FIG. 4 illustrates an example portion 400 of a receive chain 202 (of FIG. 2) that includes multiple mixers and multiple polyphase filters. As shown, the portion 400 can include "P" polyphase filters 130-1, 130-2, . . . , 130-P, where "P" corresponds to an integer greater than one. A single polyphase filter 130, however, can be used in other environments. In example implementations, the potion 400 includes multiple mixers and multiple ADCs. The multiple polyphase filters 130-1 . . . 130-P are coupled between the multiple mixers and the multiple ADCs. Multiple switches 404-1, 404-2, . . . , 404-6 are coupled between the multiple mixers and the multiple polyphase filters 130-1 . . . 130-P. A different quantity of switches, however, may be implemented instead of six. As described herein, one or more of the polyphase filters 130-1 . . . 130-P may be implemented as a polyphase transconductance-capacitor (Gm-C) filter.

The transceiver 126 (e.g., of FIG. 2) or the receive chain 202 thereof can include a polyphase filter controller 410. Generally, the polyphase filter controller 410 can be implemented as part of another controller (e.g., a transceiver controller), as part of the communication processor 124 (e.g., of FIG. 2), as a standalone component, and so forth. In example operations, the polyphase filter controller 410 is capable of engaging each polyphase filter 130 into a filter mode 308 of multiple filter modes 308-1 . . . 308-3, including at least one frequency-shift filter mode 308-2 or 308-3. To do so, the polyphase filter controller 410 can control operation of the multiple polyphase filters 130-1 . . . 130-P or the multiple switches 404-1 . . . 404-6, including both, using at least one polyphase control signal 626. As described below, each polyphase filter 130 can have multiple switches and at least one adjustable capacitor that are internal thereto, and the polyphase filter controller 410 can control these internal components. As part of the control, the polyphase filter controller 410 can cause each switch to be in a closed state, in an open state, in a particular position, or some combination thereof.

Each polyphase filter 130 includes a filter input 406 and a filter output 408, which are explicitly depicted with respect to a first polyphase filter 130-1. For a receive chain implementation, the filter input 406 is coupled to multiple mixers, and the filter output 408 is coupled to multiple ADCs. In the illustrated example, the components of the receive chain are logically organized into different downlink pipes 402-1 and 402-2. Although two are explicitly shown, a given receive chain may include a different quantity of downlink pipes. Each downlink pipe (DLP) 402 includes at least one polyphase filter 130.

A first downlink pipe 402-1 includes at least four mixers 208-1, 208-2, 208-3, and 208-4; the first polyphase filter 130-1; and two ADCs 210-1 and 210-2. The two mixers 208-1 and 208-3 and the ADC 210-1 process an in-phase signal component for the I channel. The two mixers 208-2 and 208-4 and the ADC 210-2 process a quadrature-phase signal component for the Q channel. Each channel may propagate a differential signal. Thus, each channel may have a plus signal component and a minus signal component, which is described with reference to FIG. 5.

In some cases, splitting of a current is performed to provide current that is representative of a given signal component to two or more mixers. For example, current of the I channel is split between a first mixer 208-1 and a third mixer 208-3, and current of the Q channel is split between a second mixer 208-2 and a fourth mixer 208-4. Using the multiple switches 404-1 . . . 404-6, a second polyphase filter 130-2 can process the same signal phase components, which are provided by the same four mixers, to realize a different filter mode 308 (e.g., of FIG. 3) than that realized by the first polyphase filter 130-1. These four mixers can use a single local oscillator signal that is provided from a single local oscillator (LO).

A second downlink pipe 402-2 (DLP 402-2) is arranged and coupled together analogously, which is described as follows. The second downlink pipe 402-2 includes four mixers 208-5, 208-6, 208-7, and 208-8; the second polyphase filter 130-2; and two ADCs 210-3 and 210-4. The two mixers 208-5 and 208-7 and the ADC 210-3 process an in-phase signal component for the I channel. The two mixers 208-6 and 208-8 and the ADC 210-4 process a quadrature-phase signal component for the Q channel. In some cases, current of the I channel is split between a fifth mixer 208-5 and a seventh mixer 208-7, and current of the Q channel is split between a sixth mixer 208-6 and an eighth mixer 208-8. Using the multiple switches 404-1 . . . 404-6, this current splitting enables the first polyphase filter 130-1 to process the same signal phase components as the second polyphase filter 130-2 without using two sets of four mixers and without using another local oscillator (or an additional low-noise amplifier).

In example operations, the first and second polyphase filters 130-1 and 130-2 can process the same signal phase components to provide the positive and negative frequency-shift filter modes 308-2 and 308-3. In this instance, the four mixers 208-1 to 208-4 are being used. The multiple mixers split current between the first polyphase filter 130-1 and the second polyphase filter 130-2. For instance, an in-phase current of the in-phase channel is split to produce a first in-phase current and a second in-phase current. The first in-phase current is routed to the first mixer 208-1. This provides a plus in-phase signal component and a minus in-phase signal component for the first polyphase filter 130-1. Here, the first polyphase filter 130-1 may correspond to the positive frequency-shift filter mode 308-2. The second in-phase current is routed to the third mixer 208-3 and then to the second polyphase filter 130-2. Here, the second polyphase filter 130-2 corresponds to the negative frequency-shift filter mode 308-3.

The six switches 404-1 to 404-6 are illustrated to have a switch state (e.g., an open state or a closed state) to implement this example operation. Thus, the second, third, fifth, and sixth switches 404-2, 404-3, 404-5, and 404-6 are in a closed state. The first and fourth switches 404-1 and 404-4 are in an open state. Given these switch states, the first polyphase filter 130-1 accepts an in-phase signal component from the first mixer 208-1 and a quadrature-phase signal component from the second mixer 208-2. The second polyphase filter 130-2 accepts the in-phase signal component from the third mixer 208-3 (via the closed second and third switches 404-2 and 404-3) and the quadrature-phase signal component from the fourth mixer 208-4 (via the closed fifth and sixth switches 404-5 and 404-6). Using this switching arrangement, each polyphase filter 130 can accept the same signal phase components, e.g., at a reduced current (for example, "half" current apiece when the mixers are approximately equally sized). Each polyphase filter 130 filters the signal phase components in accordance with the positive or negative frequency-shift filter mode 308-2 or 308-3. In some embodiments, the switches 404-2 and 404-5 are closed when routing current between filters 130, and are open otherwise. In some embodiments, the switches 404-1 and 404-4 are closed when splitting current using the mixers 208-7 and 208-2 for use with the filter 130-1, and are open otherwise. In some embodiments, the switches 404-3 and 404-6 are closed when splitting current using the mixers 208-3 and 208-4 for use with the filter 130-2, and are open otherwise.

Each polyphase filter 130 also outputs a filtered signal to two ADCs. For example, the first polyphase filter 130-1 outputs a filtered in-phase signal component (I channel) to a first ADC 210-1 and a filtered quadrature-phase signal component (Q channel) to a second ADC 210-2. With a polyphase filter implementation that operates in a current mode, the ADCs 210-1 and 210-2 can be implemented as current-mode ADCs. Alternatively, a current-to-voltage converter can be coupled between the filter output 408 of the first polyphase filter 130-1 and each of the first and second ADCs 210-1 and 210-2.

In the example described immediately above, both the first and second polyphase filters 130-1 and 130-2 can be independently associated with, and coupled to, separate mixers and low-noise amplifiers (e.g., a low-noise amplifier 204 as shown in FIG. 2). Additionally or alternatively, a polyphase filter, such as the "Pth" polyphase filter 130-P, can be reserved for use in conjunction with another polyphase filter 130. For example, the first polyphase filter 130-1 and the "Pth" polyphase filter 130-P can filter signal phase components using positive and negative frequency-shift filter modes 308-2 and 308-3 (of FIG. 3) for an NCCA scenario. The second polyphase filter 130-2 is then available to filter another received wireless signal using a different local oscillator frequency. In this manner, three frequency bands can be covered with the three polyphase filters 130-1, 130-2, and 130-P (where "P" equals at least three) and with two local oscillators. A fourth polyphase filter 130 (not explicitly shown) enables four frequency bands to be covered with two local oscillators if two pairs of frequency bands are within a frequency-shift amount (F_Sh, but note that the shifts need not be the same for each pair) of two respective local oscillator frequencies.

Figure 5:
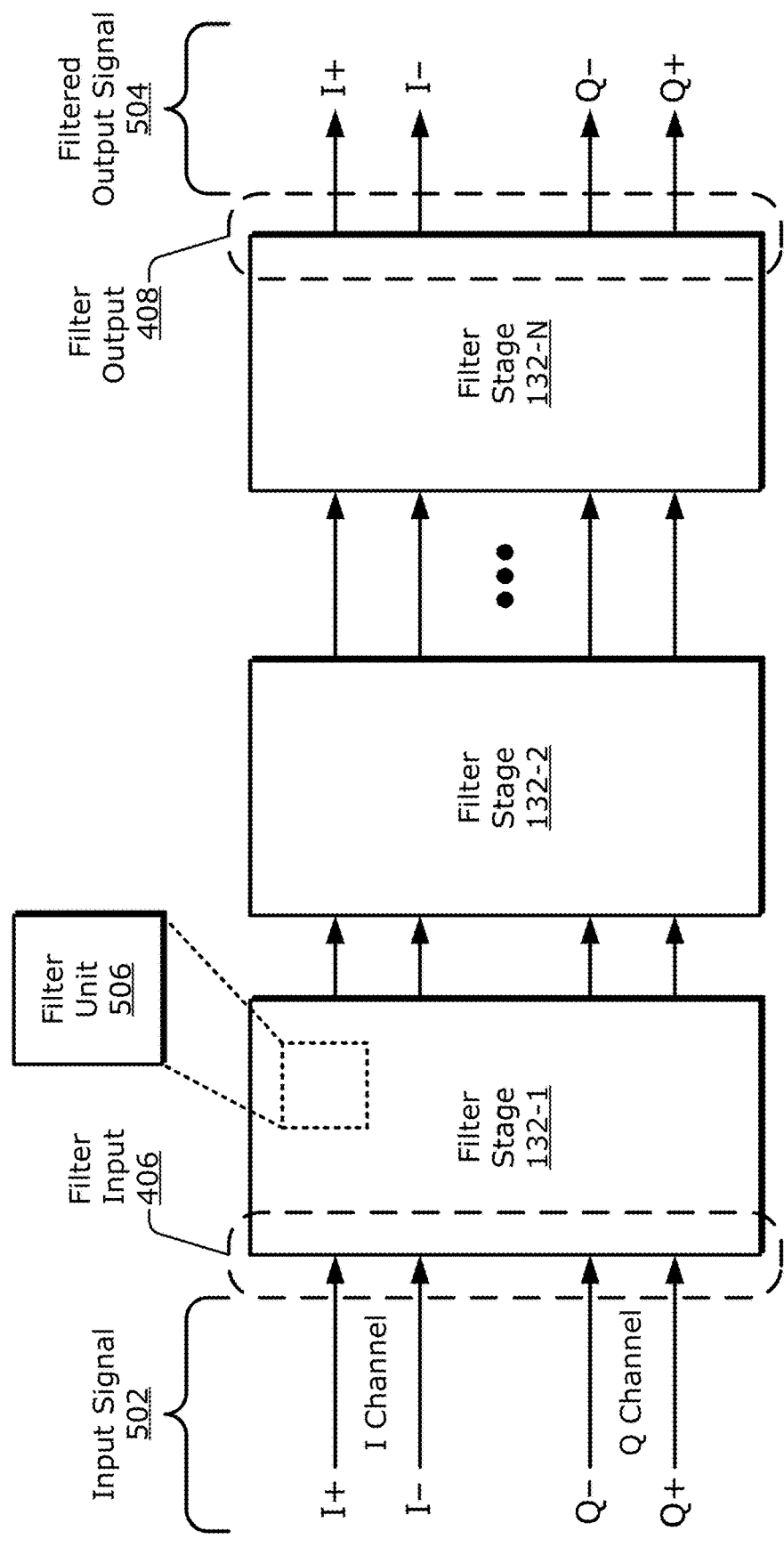
FIG. 5 illustrates an example polyphase filter that includes multiple filter stages coupled together in a chained arrangement, with each filter stage including at least one filter unit.

FIG. 5 illustrates an example polyphase filter 130 that includes multiple filter stages 132-1 . . . 132-N coupled together in a chained arrangement, with each filter stage 132 including at least one filter unit 506. In example implementations, a series-connected chain of filter stages is coupled between the filter input 406 and the filter output 408. The first filter stage 132-1 is coupled to or realizes the filter input 406 to accept an input signal 502. The input signal 502 includes a plus in-phase (I+) signal component, a minus in-phase (I−) signal component, a plus quadrature-phase (Q+) signal component, and a minus quadrature-phase (Q−) signal component. As described herein, the polyphase filter 130 may be implemented as a polyphase transconductance-capacitor (Gm-C) filter.

The first filter stage 132-1 is coupled to a second filter stage 132-2. More specifically, the second filter stage 132-2 is coupled in series with the first filter stage 132-1 between the filter input 406 and the filter output 408. Generally, each "internal" filter stage 132-2 . . . 132-(N—1) (not explicitly shown) is coupled between, and in series with, two other filter stages. The "Nth" filter stage 132-N is coupled to or realizes the filter output 408 to provide a filtered output signal 504. The filtered output signal 504 includes filtered versions of the plus in-phase (I+) signal component, the minus in-phase (I−) signal component, the plus quadrature-phase (Q+) signal component, and the minus quadrature-phase (Q−) signal component. While multiple stages are illustrated in FIG. 5, it will be understood that a single filter stage 132 may be implemented in one or more of the filters 130.

Figure 7:
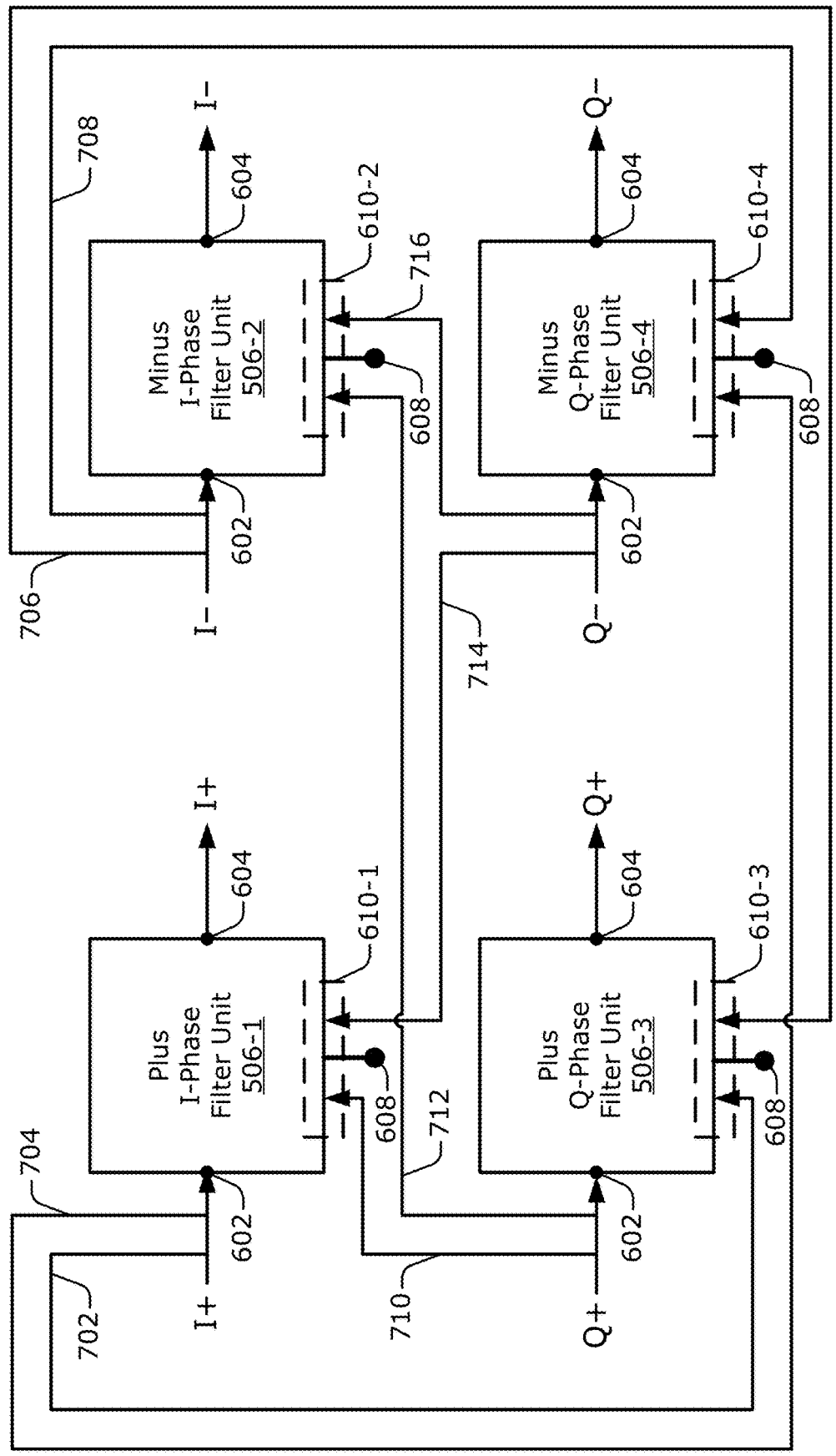
FIG. 7 is a schematic diagram illustrating a portion of an example filter stage of a polyphase filter that includes multiple filter units for differential signals having multiple phase components.
Figures 1, 8:
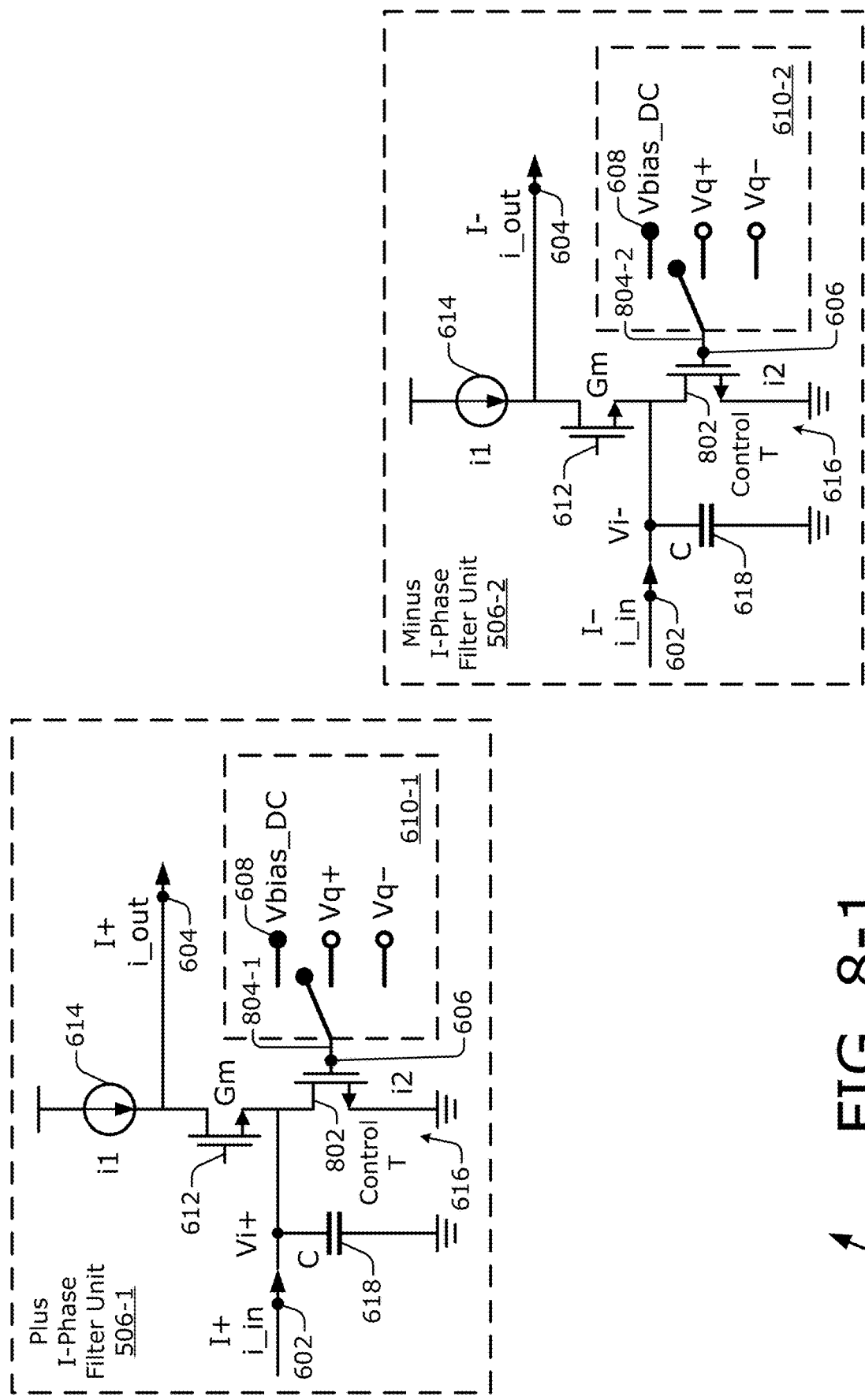
Figures 2, 8:
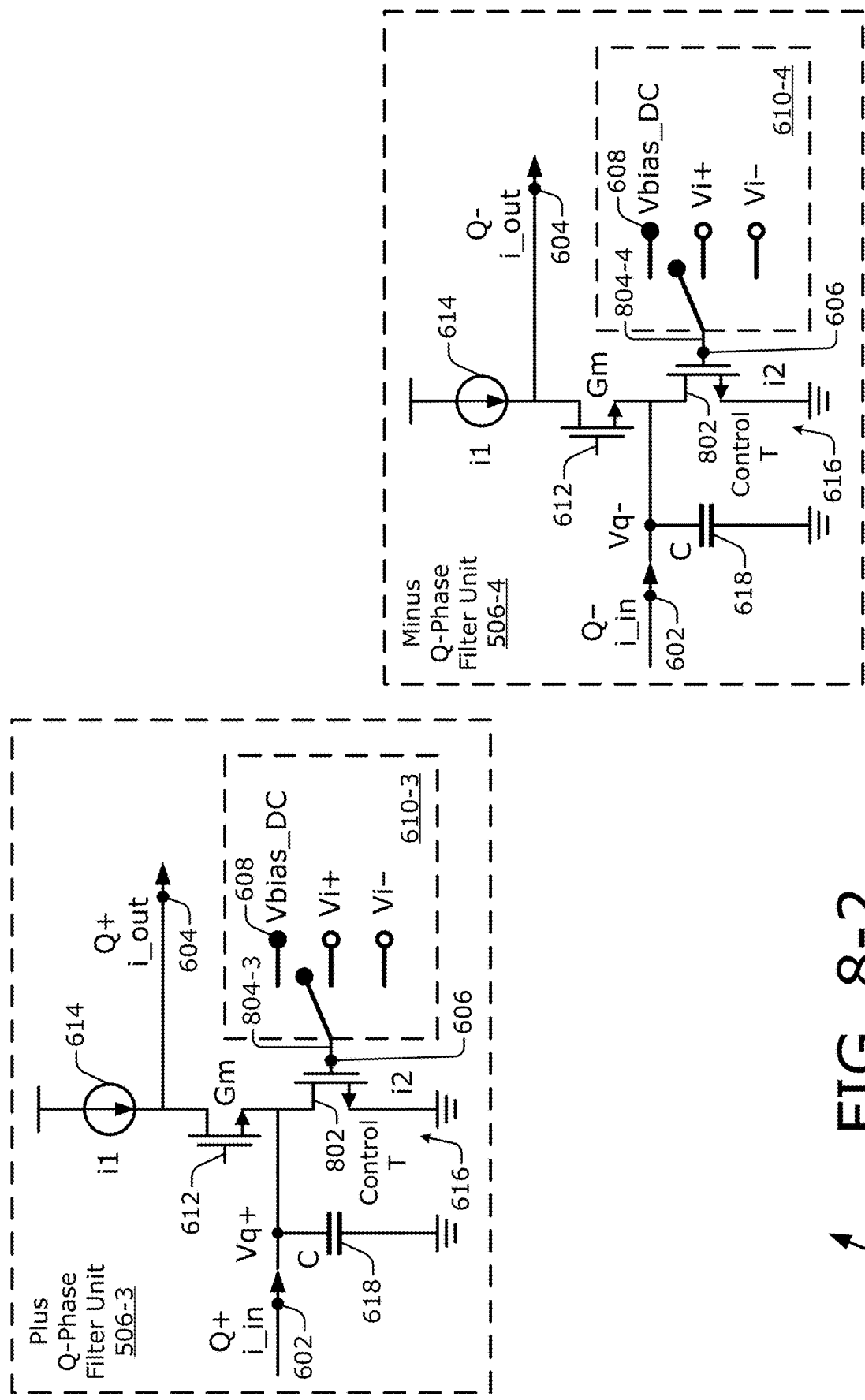

In some implementations, each filter stage 132 includes four filter units, one for each signal phase component (I+, I−, Q+, and Q−). Examples of four such filter units are described below with reference to FIGS. 7, 8-1, and 8-2. FIG. 7 schematically illustrates example signal phase cross-coupling, and FIGS. 8-1 and 8-2 illustrate example signal phase cross-coupling using circuit components. First, however, example circuitry for the filter stage 506 is described next.

Figure 6:
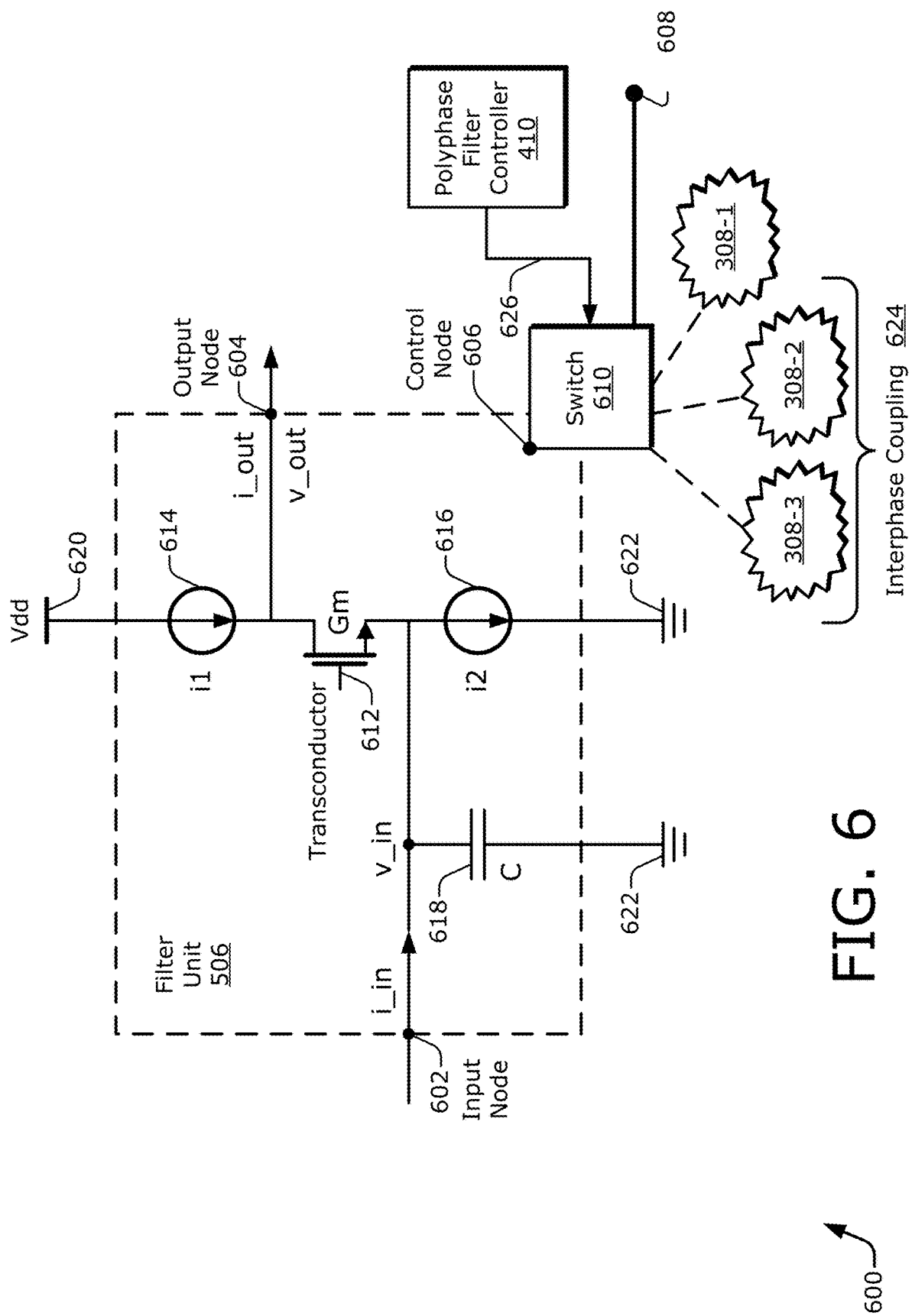
FIG. 6 illustrates an example filter unit with an associated switch to enable the set of filter modes of FIG. 3.

FIG. 6 illustrates, generally at 600, an example filter unit 506 with an associated switch 610 to enable the multiple filter modes 308-1 to 308-3 of FIG. 3. As illustrated, the filter unit 506 includes multiple nodes: an input node 602, an output node 604, and a control node 606. The filter unit 506 also includes or has access to a direct-current (DC) bias voltage node 608. The switch 610 is coupled to the control node 606 and the polyphase filter controller 410, which controls a state or position of the switch 610. FIG. 6 also includes two power distribution network nodes: a supply voltage node 620 (Vdd) and a ground node 622. The filter unit 506 can implement a transconductance-capacitor (Gm-C) filter based on at least one transconductance (Gm) unit in conjunction with a capacitor (C).

In example implementations, the switch 610 can be in an open state or a closed state. If the switch 610 is in a closed state, the switch 610 can be in one of two or more different switch positions. The switch 610 provides a control signal to the control node 606 based on a position of the switch. For example, the switch 610 can be in one of three different positions to provide for three different filter modes 308-1 to 308-3. With the lowpass filter mode 308-1, the switch 610 couples the DC bias voltage node 608 to the control node 606. With the positive and negative frequency-shift filter modes 308-2 and 308-3, interphase coupling 624 can be established to provide a frequency shift from a local oscillator frequency. Examples of circuitry for, and control of, the switch 610 are described below with reference to FIGS. 7, 8-1, and 8-2.

In some implementations, the filter unit 506 includes multiple components: a transconductor 612 (Gm), a first current source 614 (i1), a second current source 616 (i2), and a capacitor 618 (C). A filter unit 506 can, however, include more, fewer, or different components. The capacitor 618 is coupled between the input node 602 and the ground 622. The transconductor 612 can be realized using, for instance, at least one transistor as depicted. For example, the transistor may have a source directly connected to one of the current sources 614, 616 (e.g., second current source 616 in FIG. 6) and the input node 602, a drain directly connected to the other current source (e.g., first current source 614 in FIG. 6) and the output node 604, and a gate coupled to a bias. The transconductor 612, the first current source 614, and the second current source 616 are coupled together in series between two power distribution network (PDN) nodes, the supply voltage node 620 and the ground node 622. As shown, the first current source 614 is coupled between the supply voltage node 620 and the output node 604. The second current source 616 is coupled between the input node 602 and the ground node 622. The transconductor 612 is coupled between the first current source 614 and the second current source 616. Thus, the transconductor 612 is coupled between the input node 602 and the output node 604. As shown for the filter unit 506, the source terminal of the transconductor 612 is coupled to the input node 602, and the drain terminal thereof is coupled to the output node 604.

Each transistor that is illustrated in the drawings, including the example transistor that at least partially implements the transconductor 612, may be realized as a field-effect transistor (FET). In FIG. 6, the FET is implemented as an n-type FET (nFET), such as an n-type metal-oxide-semiconductor (MOS) FET (nMOSFET). The transconductor 612 can alternatively be implemented as a p-type FET (pFET), such as a p-type MOSFET (pMOSFET), as described below with reference to FIG. 9. Transistors that are described herein can, however, be implemented differently. Other example transistor types include a bipolar junction transistor (BJT), a junction FET (JFET), and so forth. Each transistor includes multiple terminals, including a control terminal and two channel terminals—a first channel terminal and a second channel terminal. With an FET, for instance, the control terminal corresponds to a gate terminal, and the two channel terminals correspond to a source terminal and a drain terminal. With a BJT, for instance, the control terminal corresponds to the base, and the two channel terminals correspond to the emitter and the collector.

In example operations, the transconductor 612 is biased into analog operation to amplify an incoming signal to produce an outgoing signal. An input current (i_in) enters the filter unit 506 via the input node 602. An output current (i_out) exits the filter unit 506 via the output node 604. An input voltage (v_in) is present at the input node 602, and an output voltage (v_out) is present at the output node 604. The first and second current sources 614 and 616 establish a baseline current flow (e.g., a direct-current (DC) current) through the channel of the transconductor 612. Accordingly, the transconductor 612 produces an output current (i_out) based on the input voltage (v_in), the transconductance value (Gm), and the current from the first and/or second current sources 614, 616. The filter unit 506 therefore operates as a transconductance unit.

A pole provided by the filter unit 506 for a polyphase filter is based on the transconductance (Gm) of the transconductor 612 and a capacitance of the capacitor 618. For instance, a frequency of the pole is based on 1/Gm of the nMOSFET source impedance of the transconductor 612 and the capacitive value of the capacitor 618. In this manner, the filter unit 506 can contribute a pole to a response of the polyphase filter 130. The filter unit 506 also establishes an amount of frequency shift (F_Sh) by the polyphase filter. The frequency-shift amount is based on the capacitance of the capacitor 618 and one or more characteristics of the first and/or second current sources 614, 616. For example, in the configuration illustrated in FIG. 6, the control node 606 may be coupled to the second current source 616 or may comprise a control node of the second current source 616, and the switch may be configured to control whether a shift (and how much of a shift) is implemented based on selectively coupling one or more signals to the second current source 616 or portions thereof. Thus, the filter unit 506 can contribute a frequency-shift amount (F_Sh) to a response of the polyphase filter 130. Relevant example characteristics of the second current source 616 are described below with reference to FIGS. 8-1 and 8-2.

For both the pole frequency of the filtering performance and the frequency-shift amount for the polyphasic aspect, the capacitance of the capacitor 618 can be adjustable to enable changing the pole frequency or the frequency-shift amount using the capacitor 618. Thus, the capacitor 618 can be implemented as an adjustable capacitor that is associated with (e.g., that has or provides) an adjustable capacitance. Additionally or alternatively, the transconductor 612 can be biased with different voltages to adjust the transconductance (Gm) value thereof.

FIG. 7 is a schematic diagram illustrating a portion of an example filter stage 132 of a polyphase filter that includes multiple filter units 506-1 . . . 506-4 for differential signals having multiple phase components. FIG. 7 depicts interphase coupling between or among the multiple filter units 506-1 . . . 506-4. As illustrated, the filter stage 132 includes four filter units 506-1, 506-2, 506-3, and 506-4 and four switches 610-1, 610-2, 610-3, 610-4 to account for four signal phase components. A filter stage 132 may, however, include a different quantity of filter units or switches. For example, eight or sixteen different filter units may be implemented, and each may be configured to process a respective signal phase component.

In some cases, each respective filter unit 506 of multiple filter units 506-1 . . . 506-4 is associated with, and coupled to, a respective switch 610 of multiple switches 610-1 . . . 610-4. For example, a plus in-phase filter unit 506-1 is associated with, and coupled to, a plus in-phase switch 610-1. Also, a minus in-phase filter unit 506-2 is associated with, and coupled to, a minus in-phase switch 610-2. Similarly, a plus quadrature-phase filter unit 506-3 is associated with, and coupled to, a plus quadrature-phase switch 610-3. Further, a minus quadrature-phase filter unit 506-4 is associated with, and coupled to, a minus quadrature-phase switch 610-4. As described below with reference to FIGS. 8-1 and 8-2, each respective switch 610 provides a respective control signal to a respective filter unit 506.

As illustrated, the filter stage 132 includes a respective filter unit for each of a plus in-phase signal component (I+), a minus in-phase signal component (I−), a plus quadrature-phase signal component (Q+), and a minus quadrature-phase signal component (Q−). More specifically, the plus in-phase filter unit 506-1 processes the plus in-phase signal component (I+). The minus in-phase filter unit 506-2 processes the minus in-phase signal component (I−). The plus quadrature-phase filter unit 506-3 processes the plus quadrature-phase signal component (Q+). The minus quadrature-phase filter unit 506-4 processes the minus quadrature-phase signal component (Q−).

In example implementations, each filter unit 506 is switchably cross-coupled to a different phase component via a respective switch 610. The plus in-phase filter unit 506-1 is selectively coupled (by the plus in-phase switch 610-1) to the input node 602 of the plus quadrature-phase filter unit 506-3 as indicated by the line 710 or to the input node 602 of the minus quadrature-phase filter unit 506-4 as indicated by the line 714. The minus in-phase filter unit 506-2 is selectively coupled (by the minus in-phase switch 610-2) to the input node 602 of the plus quadrature-phase filter unit 506-3 as indicated by the line 712 or to the input node 602 of the minus quadrature-phase filter unit 506-4 as indicated by the line 716.

The plus quadrature-phase filter unit 506-3 is selectively coupled (by the plus quadrature-phase switch 610-3) to the input node 602 of the plus in-phase filter unit 506-1 as indicated by the line 702 or to the input node 602 of the minus in-phase filter unit 506-2 as indicated by the line 706. The minus quadrature-phase filter unit 506-4 is selectively coupled (by the minus quadrature-phase switch 610-4) to the input node 602 of the plus in-phase filter unit 506-1 as indicated by the line 704 or to the input node 602 of the minus in-phase filter unit 506-2 as indicated by the line 708. Each filter unit 506 can also be selectively coupled to the DC bias voltage node 608 via the respective switch 610. Examples of the switchable coupling, which omits additional transconductance units, and the circuitry for the switch 610 are described next with reference to FIGS. 8-1 and 8-2. It will be understood that while the switches 610 are illustrated in FIG. 7 (and in FIGS. 8-1 and 8-2) as being collocated with a respective filter unit 506, the switches 610 may be implemented in other locations, or other means may be implemented for selectively coupling a phase signal component from another filter unit to a control node of the respective filter unit.

FIGS. 8-1 and 8-2 are circuit diagrams 800-1 and 800-2, respectively, illustrating portions of an example filter stage 132 of a polyphase filter 130 (e.g., of FIGS. 5 and 7). The portions include four filter units 506-1 to 506-4 for differential signals of two phase signal components. The circuit diagram 800-1 includes the plus in-phase filter unit 506-1 and the minus in-phase filter unit 506-2. The circuit diagram 800-2 includes the plus quadrature-phase filter unit 506-3 and the minus quadrature-phase filter unit 506-4.

In example implementations, the second current source 616 is realized using a control transistor 802 (control T 802). As shown in FIGS. 8-1 and 8-2, the control transistor 802 comprises an nMOSFET; however, the control transistor 802 can be implemented using a different transistor type. The control transistor 802 is coupled between the transconductor 612 and the ground node, with a source terminal of the control transistor 802 coupled to the ground node. The interphase coupling is implemented using a control transistor 802 implementation of the second current source 616 and the switch 610.

With reference to the plus in-phase filter unit 506-1, by way of example, the control node 606 is realized as the control terminal of the control transistor 802. With the depicted FET implementation of the control transistor 802, the control terminal of the control transistor 802 comprises a gate terminal thereof. To provide a plus in-phase control signal 804-1, the plus in-phase switch 610-1 can selectively couple the gate terminal of the control transistor 802 to the DC bias voltage via the DC bias voltage node 608, to the plus quadrature-phase voltage (Vq+) (e.g., at the input node 602 of the plus quadrature-phase filter unit 506-3 (of FIG. 8-2)), or to the minus quadrature-phase voltage (Vq−) (e.g., at the input node 602 of the minus quadrature-phase filter unit 506-4 (also of FIG. 8-2)). The input node 602 of the plus in-phase filter unit 506-1 corresponds to a plus in-phase voltage (Vi+).

The quadrature-phase signal components can thus be cross-coupled with the in-phase signal components (and vice versa) using the gate terminal of the control transistor 802 of each filter unit 506. This obviates the use of additional transconductance units for the interphase coupling. This control-terminal-based coupling also "reuses" the current that is already flowing along the series-connection of components that is coupled between the supply voltage node and the ground node. As the voltage bias at the gate terminal of the control transistor 802 of the plus in-phase filter unit 506-1 changes based on the plus or minus quadrature-phase voltage (Vq+ or Vq−), the current pulled by the second current source 616 changes. This change to the current flow, which is between the input node 602 and the ground node along the channel of the control transistor 802, also changes how much current flows through the channel of the transistor of the transconductor 612. This in turn changes the output current (i_out).

As described above, the amount of the frequency shift (F_Sh) provided by the interphase coupling of the polyphase filter can be changed by adjusting the capacitance of the capacitor 618. This frequency-shift amount is based on the capacitance of the capacitor 618 and the transconductance (Gm) of the control transistor 802. For instance, the amount of the frequency shift can be proportional to the Gm of the control transistor 802 divided by the capacitive value of the capacitor 618. The frequency-shift amount (F_Sh) can therefore also be changed by changing the transconductance (Gm) of the control transistor 802.

To do so, an array of multiple control transistors can be coupled to each other in parallel between the input node 602 and the ground node. Each respective control transistor 802 can be individually controlled by a respective switch 610. An amount of the frequency shift can be controlled by changing a ratio of how many such control transistors are coupled to the DC bias voltage node 608 and how many of these control transistors are coupled to one of the quadrature-phase voltages (Vq+ or Vq−). These multiple control transistors can also be weighted to increase a granularity of controllability. Example weighting schemes include binary, thermometer-coded, logarithmic, and so forth. With a binary weighting scheme and five control transistors, for instance, the weights can correspond to 1×, 2×, 4×, 8×, and 16×; this can provide 32 different combinations for 32 potentially-different interphase coupling strengths. These different coupling strengths can also be combined with adjustable capacitive values of the capacitor 618 to further increase a granularity or a bandwidth of the frequency shifting (F_Sh) available to a polyphase filter.

With reference to the minus in-phase filter unit 506-2, the input node 602 corresponds to a minus in-phase voltage (Vi−). The minus in-phase switch 610-2 can selectively couple the gate terminal of the control transistor 802 to bias voltages to provide a minus in-phase control signal 804-2. These bias voltages include a DC bias voltage via the DC bias voltage node 608, the plus quadrature-phase voltage (Vq+) at the input node 602 of the plus quadrature-phase filter unit 506-3 (of FIG. 8-2), and the minus quadrature-phase voltage (Vq−) at the input node 602 of the minus quadrature-phase filter unit 506-4.

With reference to the plus quadrature-phase filter unit 506-3 in FIG. 8-2, the input node 602 corresponds to a plus quadrature-phase voltage (Vq+). To provide a plus quadrature-phase control signal 804-3, the plus quadrature-phase switch 610-3 can selectively couple the gate terminal of the control transistor 802 to the DC bias voltage via the DC bias voltage node 608, to the plus in-phase voltage (Vi+) (e.g., at the input node 602 of the plus in-phase filter unit 506-1 (of FIG. 8-1)), or to the minus in-phase voltage (Vi−) (e.g., at the input node 602 of the minus in-phase filter unit 506-2).

With reference to the minus quadrature-phase filter unit 506-4, the input node 602 corresponds to a minus quadrature-phase voltage (Vq−). The minus quadrature-phase switch 610-4 can selectively couple the gate terminal of the control transistor 802 to a bias voltage to provide a minus quadrature-phase control signal 804-4. The bias voltage can be selected from a DC bias voltage via the DC bias voltage node 608, the plus in-phase voltage (Vi+) at the input node 602 of the plus in-phase filter unit 506-1, and the minus in-phase voltage (Vi−) at the input node 602 of the minus in-phase filter unit 506-2.

In example operations, to provide a frequency shift, each given filter unit 506 is coupled to a different signal phase component than the one being processed by the given filter unit 506. For example, a filter unit processing an in-phase signal component is coupled to a quadrature-phase signal component as represented by at least one of a current or a voltage. To provide a positive frequency shift (+F_Sh), the respective switch 610-1 or 610-2 of each of the plus and minus in-phase filter units 506-1 and 506-2 can couple a respective control node 606 to the plus quadrature-phase voltage (Vq+). Further, the respective switch 610-3 or 610-4 of each of the plus and minus quadrature-phase filter units 506-3 and 506-4 can couple a respective control node 606 to the plus in-phase voltage (Vi+). On the other hand, to provide a negative frequency shift (−F_Sh), the respective switch 610-1 or 610-2 of each of the plus and minus in-phase filter units 506-1 and 506-2 can couple a respective control node 606 to the minus quadrature-phase voltage (Vq−). Further, the respective switch 610-3 or 610-4 of each of the plus and minus quadrature-phase filter units 506-3 and 506-4 can couple a respective control node 606 to the minus in-phase voltage (Vi−).

The coupling and the resulting frequency-shifting can, however, be performed in alternative manners. For instance, each respective in-phase filter unit can receive a voltage from a polarity-corresponding quadrature-phase filter unit for a positive frequency shift. In this approach, the plus in-phase filter unit 506-1 is coupled to the plus quadrature-phase voltage (Vq+), and the minus in-phase filter unit 506-2 is coupled to the minus quadrature-phase voltage (Vq−) for a positive frequency shift. Thus, for a negative frequency shift, the plus in-phase filter unit 506-1 is coupled to the minus quadrature-phase voltage (Vq−), and the minus in-phase filter unit 506-2 is coupled to the plus quadrature-phase voltage (Vq+). The respective quadrature-phase filter units are analogously coupled to the in-phase voltages—e.g., like polarity for a positive frequency shift and opposite polarity for a negative frequency shift. Further, while control of a transistor (802) in the second current source 616 is illustrated in FIGS. 8-1 and 8-2, in other embodiments a transistor in the first current source 614 may alternatively or additionally be controlled, for example by being selectively coupled to a bias voltage or a phase signal component from another filter unit.

Figure 9:
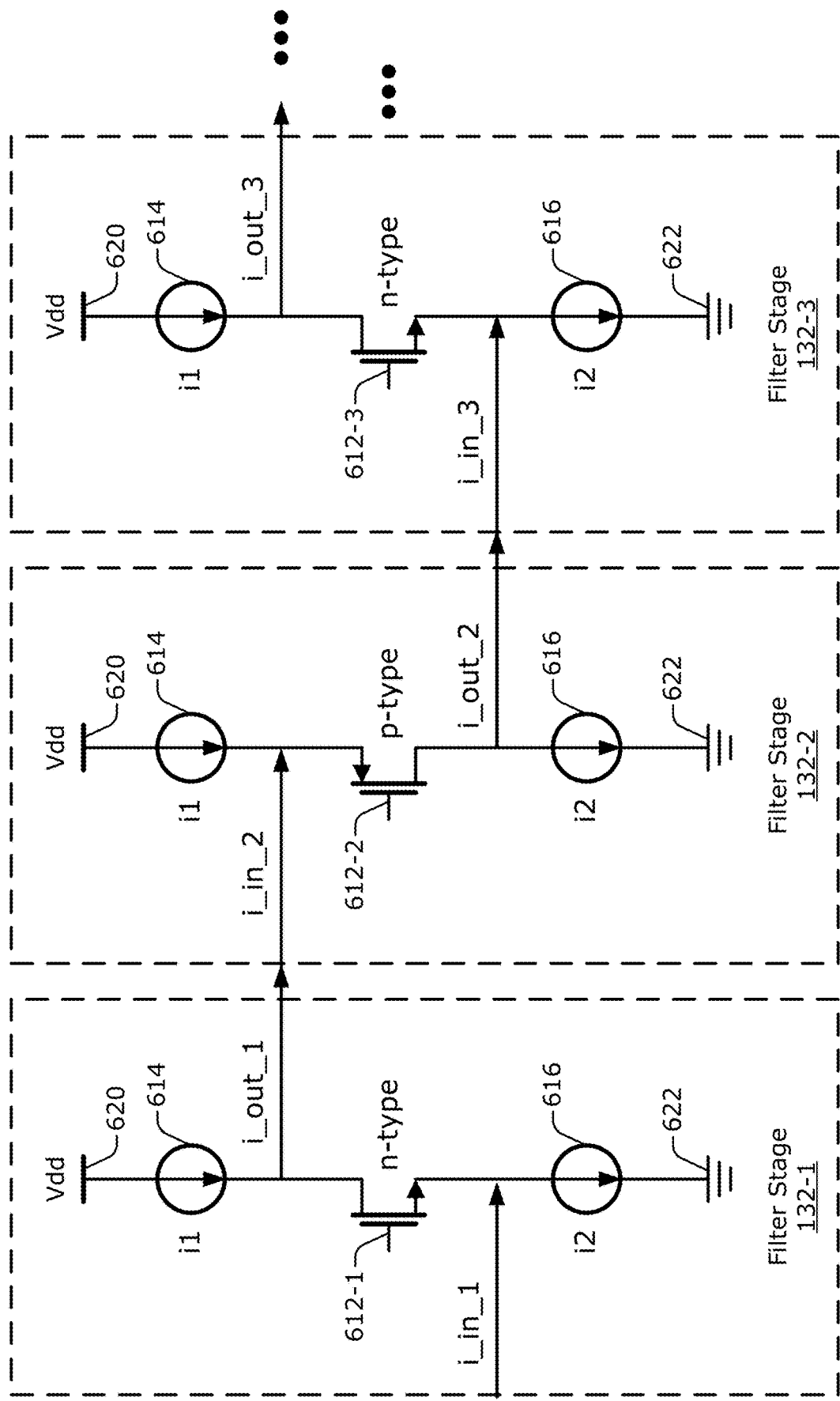
FIG. 9 is a circuit diagram illustrating a portion of multiple filter stages of a polyphase filter to depict an example scheme for cascading filter units across the multiple filter stages in a series-connected chain.

FIG. 9 is a circuit diagram illustrating a portion 900 of multiple filter stages 132-1 . . . 132-N of a polyphase filter to depict an example scheme for cascading filter units across the multiple filter stages in a series-connected chain. In some embodiments, such cascading enables higher order filters to be implemented. In the example polyphase filter of FIG. 9, "N" is equal to three or more. The example scheme for cascading multiple filter units for a given signal phase component illustrates how transistors of different doping types can be used to manage available voltage headroom between a supply voltage node 620 and a ground node 622. As shown, a first filter stage 132-1 includes an n-type MOSFET for a transconductor 612-1 (e.g., an n-type transistor at least partially implementing the transconductor). A second filter stage 132-2 includes a p-type MOSFET for a transconductor 612-2 (e.g., a p-type transistor at least partially implementing the transconductor). A third filter stage 132-3 includes another n-type MOSFET for a transconductor 612-3.

By alternating the doping type of the transconductor 612 between two consecutive filter stages along a series-connected chain of filter stages, the source terminal of the transistor of the transconductor 612 is "flipped" at each filter stage. For n-type transistors, the source terminal is nearer the ground node 622, and for p-type transistors the source terminal is nearer the supply voltage node 620. Thus, an output current (i_out) at the drain terminal of one filter stage can provide the input current (i_in) at the source terminal of the next consecutive filter stage. For example, the output current (i_out_1) at the first filter stage 132-1 serves as the input current (i_in_2) for the second filter stage 132-2. Further, the gate-source voltage (Vgs) of each alternating transistor cancels each other out instead of gradually consuming the voltage headroom provided by the supply voltage.

As is apparent from the portion 900, an output node of one filter stage 132 can comprise an input node of a succeeding filter stage 132 that is consecutively connected to the preceding filter stage. Thus, the interphase coupling that is described above with reference to FIGS. 7, 8-1, and 8-2 can also use voltages of output nodes to control each switch 610. In other words, the input node of one filter unit may comprise an output node of another filter unit. The filter units depicted in these figures may therefore be part of different filter stages. For example, four filter units (506) may be coupled together as illustrated in FIG. 7 and implemented in the first filter stage 132-1, and coupled to respective filter units (506) implemented in the second filter stage 132-2 as illustrated in FIG. 9.

Figure 10:
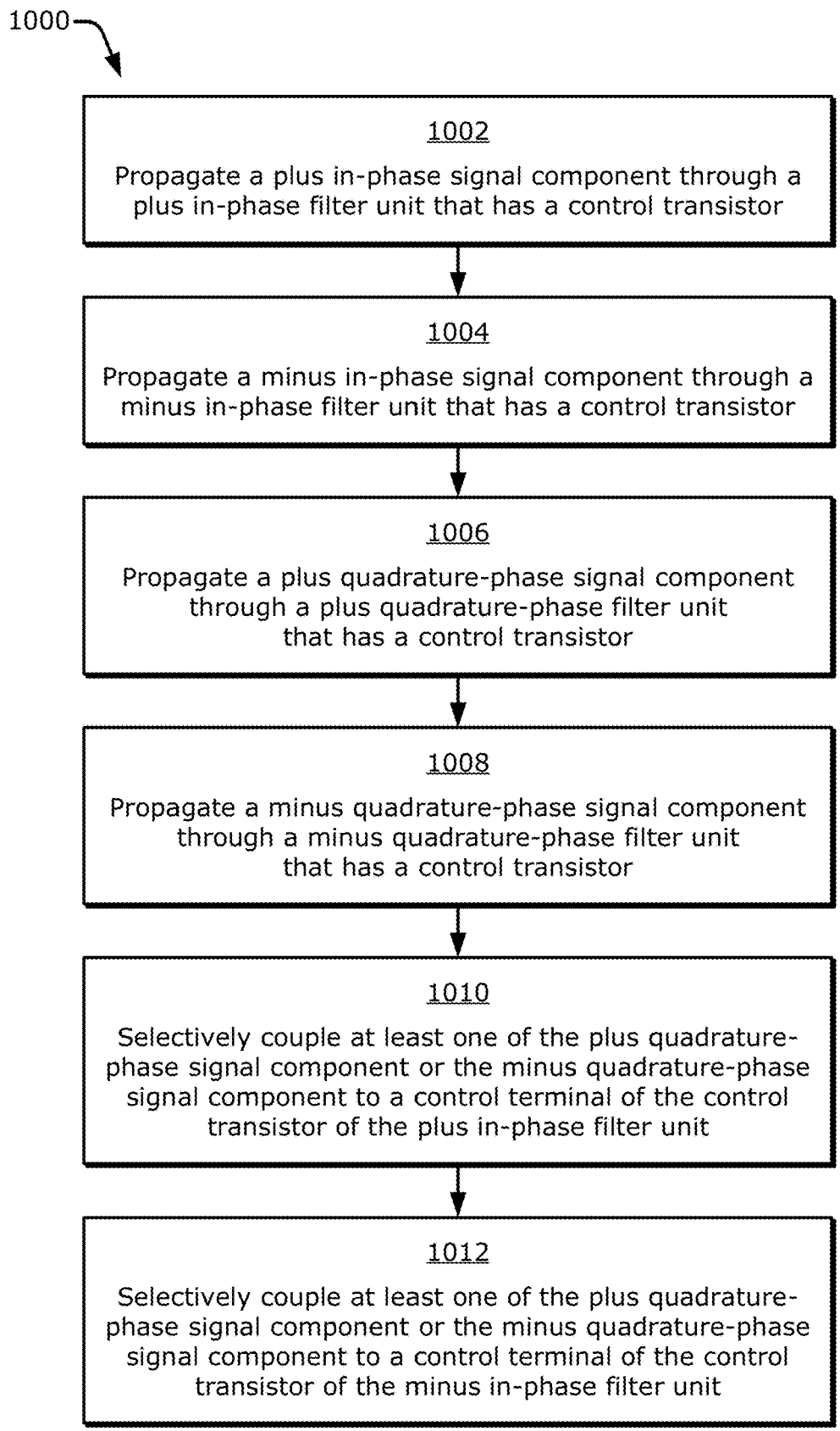
FIG. 10 is a flow diagram illustrating an example process for operating a polyphase filter with interphase coupling, which filter may be implemented as a polyphase transconductance-capacitor (Gm-C) filter.

FIG. 10 is a flow diagram illustrating an example process 1000 for operating a polyphase filter with interphase coupling. The process 1000 is described in the form of a set of blocks 1002-1012 that specify operations that can be performed. However, operations are not necessarily limited to the order shown in FIG. 10 or described herein, for the operations may be implemented in alternative orders or in fully or partially overlapping manners. Also, more, fewer, and/or different operations may be implemented to perform the process 1000, or an alternative process. Operations represented by the illustrated blocks of the process 1000 may be performed by an electronic device 102 (e.g., of FIG. 1), including by wireless interface device 120 or a polyphase filter 130 thereof, including a polyphase transconductance-capacitor (Gm-C) filter 130. More specifically, the operations of the process 1000 may be performed by multiple filter units 506-1 to 506-F and multiple switches 610-1 to 610-S, with "F" and "S" representing the same or different positive integers.

At 1002, a plus in-phase signal component is propagated through a plus in-phase filter unit that comprises a control transistor. For example, a polyphase filter 130 can propagate a plus in-phase signal component (I+) through a plus in-phase filter unit 506-1 that includes a control transistor 802. For instance, the plus in-phase filter unit 506-1 may propagate the plus in-phase signal component (I+) between an input node 602 and an output node 604 of the plus in-phase filter unit 506-1.

At 1004, a minus in-phase signal component is propagated through a minus in-phase filter unit that comprises a control transistor. For example, a polyphase filter 130 can propagate a minus in-phase signal component (I−) through a minus in-phase filter unit 506-2 that includes a control transistor 802. To do so, a transconductor 612 of the minus in-phase filter unit 506-2 may produce an output current (i_out) based on an input voltage (v_in) and a transconductance (Gm) of the transconductor 612.

At 1006, a plus quadrature-phase signal component is propagated through a plus quadrature-phase filter unit that comprises a control transistor. For example, a polyphase filter 130 can propagate a plus quadrature-phase signal component (Q+) through a plus quadrature-phase filter unit 506-3 that includes a control transistor 802. Here, the control transistor 802 may function as a current source, such as the second current source 616.

At 1008, a minus quadrature-phase signal component is propagated through a minus quadrature-phase filter unit that comprises a control transistor. For example, a polyphase filter 130 can propagate a minus quadrature-phase signal component (Q−) through a minus quadrature-phase filter unit 506-4 that includes a control transistor 802. In some cases, a current flowing through the control transistor 802 may affect a magnitude of an output current (i_out) of the minus quadrature-phase filter unit 506-4.

At 1010, at least one of the plus quadrature-phase signal component or the minus quadrature-phase signal component is selectively coupled to a control terminal of the control transistor of the plus in-phase filter unit. For example, a polyphase filter 130 can selectively couple at least one of the plus quadrature-phase signal component (Q+) or the minus quadrature-phase signal component (Q−) to a control terminal of the control transistor 802 of the plus in-phase filter unit 506-1. For instance, based on a polyphase control signal 626 provided by a polyphase filter controller 410, a plus in-phase switch 610-1 may couple a plus quadrature-phase voltage (Vq+), which is representative of the plus quadrature-phase signal component (Q+), or a minus quadrature-phase voltage (Vq−), which is representative of the minus quadrature-phase signal component (Q−), to a gate terminal of an FET implementation of the control transistor 802 of the plus in-phase filter unit 506-1.

At 1012, at least one of the plus quadrature-phase signal component or the minus quadrature-phase signal component is selectively coupled to a control terminal of the control transistor of the minus in-phase filter unit. For example, a polyphase filter 130 can selectively couple at least one of the plus quadrature-phase signal component (Q+) or the minus quadrature-phase signal component (Q−) to a control terminal of the control transistor 802 of the minus in-phase filter unit 506-2. By coupling at least one of the quadrature-phase signal components (Q+ or Q−) to the control terminal of the control transistor 802, a flow of an existing current within the minus in-phase filter unit 506-2 (e.g., a current flowing through a transconductor 612) may be impacted to achieve interphase coupling and thus a frequency shift of the frequency band targeted for passing by the polyphase filter 130.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for filtering a signal, the apparatus comprising:
   a polyphase filter comprising:
      a direct-current (DC) bias voltage node;
      a plus in-phase filter unit comprising an input node, an output node, and a control node;
      a minus in-phase filter unit comprising an input node, an output node, and a control node;
      a plus quadrature-phase filter unit comprising an input node, an output node, and a control node;
      a minus quadrature-phase filter unit comprising an input node, an output node, and a control node;
      a plus in-phase switch coupled to the control node of the plus in-phase filter unit, the DC bias voltage node, and one or both of the input node of the plus quadrature-phase filter unit and the input node of the minus quadrature-phase filter unit;
      a minus in-phase switch coupled to the control node of the minus in-phase filter unit, the DC bias voltage node, and one or both of the input node of the plus quadrature-phase filter unit and the input node of the minus quadrature-phase filter unit;
      a plus quadrature-phase switch coupled to the control node of the plus quadrature-phase filter unit, the DC bias voltage node, and one or both of the input node of the plus in-phase filter unit and the input node of the minus in-phase filter unit; and
      a minus quadrature-phase switch coupled to the control node of the minus quadrature-phase filter unit, the DC bias voltage node, and one or both of the input node of the plus in-phase filter unit and the input node of the minus in-phase filter unit.

2. The apparatus of claim 1, wherein:
   the plus in-phase filter unit comprises a control transistor, the control transistor comprising a control terminal;
   the control node of the plus in-phase filter unit is coupled to the control terminal of the control transistor of the plus in-phase filter unit;
   the minus in-phase filter unit comprises a control transistor, the control transistor comprising a control terminal; and
   the control node of the minus in-phase filter unit is coupled to the control terminal of the control transistor of the minus in-phase filter unit.

3. An apparatus for filtering a signal, the apparatus comprising:
a polyphase filter comprising:
a direct-current (DC) bias voltage node;
a plus in-phase filter unit comprising an input node, an output node, and a control node;
a minus in-phase filter unit comprising an input node, an output node, and a control node;
a plus quadrature-phase filter unit comprising an input node, an output node, and a control node;
a minus quadrature-phase filter unit comprising an input node, an output node, and a control node;
a plus in-phase switch coupled to the control node of the plus in-phase filter unit, the DC bias voltage node, and both of the input node of the plus quadrature-phase filter unit and the input node of the minus quadrature-phase filter unit; and
a minus in-phase switch coupled to the control node of the minus in-phase filter unit, the DC bias voltage node, and both of the input node of the plus quadrature-phase filter unit and the input node of the minus quadrature-phase filter unit,
the plus in-phase switch configured to selectively couple the DC bias voltage node, the input node of the plus quadrature-phase filter unit, or the input node of the minus quadrature-phase filter unit to the control node of the plus in-phase filter unit; and
the minus in-phase switch configured to selectively couple the DC bias voltage node, the input node of the plus quadrature-phase filter unit, or the input node of the minus quadrature-phase filter unit to the control node of the minus in-phase filter unit.

4. The apparatus of claim 3, further comprising:
a plus quadrature-phase switch coupled to the control node of the plus quadrature-phase filter unit, the DC bias voltage node, and both of the input node of the plus in-phase filter unit and the input node of the minus in-phase filter unit; and
a minus quadrature-phase switch coupled to the control node of the minus quadrature-phase filter unit, the DC bias voltage node, and both of the input node of the plus in-phase filter unit and the input node of the minus in-phase filter unit,
the plus quadrature-phase switch configured to selectively couple the DC bias voltage node, the input node of the plus in-phase filter unit, or the input node of the minus in-phase filter unit to the control node of the plus quadrature-phase filter unit; and
the minus quadrature-phase switch configured to selectively couple the DC bias voltage node, the input node of the plus in-phase filter unit, or the input node of the minus in-phase filter unit to the control node of the minus quadrature-phase filter unit.

5. The apparatus of claim 1, wherein the plus in-phase filter unit comprises:
a first current source;
a second current source; and
a transconductor coupled between the first current source and the second current source,
wherein the first current source, the second current source, and the transconductor are coupled together in series between a supply voltage node and a ground node.

6. The apparatus of claim 5, wherein:
the transconductor comprises a gate terminal, a source terminal, and a drain terminal;
the source terminal is coupled to the input node of the plus in-phase filter unit; and
the drain terminal is coupled to the output node of the of the plus in-phase filter unit.

7. The apparatus of claim 6, wherein:
the polyphase filter is configured to operate in a current mode;
the input node of the plus in-phase filter unit is configured to accept an input current for the plus in-phase filter unit; and
the output node of the plus in-phase filter unit is configured to provide an output current for the plus in-phase filter unit.

8. The apparatus of claim 6, wherein the plus in-phase filter unit comprises a capacitor coupled between the source terminal of the transconductor and the ground node.

9. The apparatus of claim 8, wherein:
the capacitor is associated with a capacitance;
the transconductor is associated with a transconductance; and
the plus in-phase filter unit is configured to contribute a pole to a response of the polyphase filter, the pole having a frequency that is based on the capacitance of the capacitor and the transconductance of the transconductor.

10. The apparatus of claim 8, wherein:
the capacitor is associated with a capacitance;
the second current source comprises a control transistor;
the control transistor is associated with a transconductance; and
the plus in-phase filter unit is configured to contribute a frequency shift to a response of the polyphase filter, the frequency shift having a frequency-shift amount that is based on the capacitance of the capacitor and the transconductance of the control transistor.

11. The apparatus of claim 8, wherein the capacitor comprises an adjustable capacitor that is associated with an adjustable capacitance.

12. The apparatus of claim 5, wherein the second current source comprises:
a first control transistor; and
a second control transistor coupled in parallel with the first control transistor.

13. The apparatus of claim 12, wherein:
the control node of the plus in-phase filter unit comprises a first control node;
the plus in-phase filter unit further comprises a second control node;
the first control transistor is coupled to the first control node;
the second control transistor is coupled to the second control node; and
the plus in-phase switch is configured to independently couple the DC bias voltage node, the input node of the plus quadrature-phase filter unit, or the input node of the minus quadrature-phase filter unit to the first control node and the second control node, respectively, to separately control the first control transistor and the second control transistor.

14. The apparatus of claim 1, wherein:
the polyphase filter comprises a polyphase transconductance-capacitor (Gm-C) filter; and
the polyphase transconductance-capacitor filter is configured to operate in multiple filter modes, the multiple filter modes comprising:
a lowpass filter mode; and
at least one frequency-shift filter mode.

15. The apparatus of claim 14, wherein:
the at least one frequency-shift filter mode comprises a negative frequency-shift filter mode and a positive frequency-shift filter mode; and
the polyphase transconductance-capacitor filter is configured to change between two filter modes of the multiple filter modes based on a switch position of the plus in-phase switch and a switch position of the minus in-phase switch.

16. The apparatus of claim 1, wherein the polyphase filter comprises:
a filter input;
a filter output;
a first filter stage; and
a second filter stage coupled in series with the first filter stage between the filter input and the filter output, the second filter stage comprising:
the plus in-phase filter unit, the minus in-phase filter unit, the plus quadrature-phase filter unit, and the minus quadrature-phase filter unit.

17. The apparatus of claim 16, wherein:
the polyphase filter comprises a series-connected chain of filter stages, the series-connected chain of filter stages comprising the first filter stage and the second filter stage;
the second filter stage is coupled consecutively after the first filter stage along the series-connected chain of filter stages;
the first filter stage comprises another plus in-phase filter unit that comprises an n-type field-effect transistor (NFET) configured as a transconductor; and
the plus in-phase filter unit of the second filter stage comprises a p-type field-effect transistor (PFET) configured as another transconductor, the PFET coupled consecutively to the NFET along the series-connected chain of filter stages.

18. The apparatus of claim 1, further comprising:
one or more mixers; and
at least one analog-to-digital converter,
wherein the polyphase filter is coupled between the one or more mixers and the at least one analog-to-digital converter.

19. The apparatus of claim 18, wherein:
the polyphase filter comprises a first polyphase filter;
the one or more mixers comprise multiple mixers; and
the apparatus further comprises:
a second polyphase filter; and
multiple switches, each switch of the multiple switches coupled between:
at least one mixer of the multiple mixers; and
the first polyphase filter or the second polyphase filter.

20. The apparatus of claim 19, wherein the multiple mixers are configured to split current between at least the first polyphase filter and the second polyphase filter, and a single local oscillator is coupled to the multiple mixers and configured to provide a single local oscillator signal to the multiple mixers that feed both the first polyphase filter and the second polyphase filter.

21. The apparatus of claim 1, further comprising:
at least one antenna; and
a wireless interface device coupled to the at least one antenna, the wireless interface device comprising the polyphase filter.

22. An apparatus for filtering a signal, the apparatus comprising:
at least one antenna;
a wireless interface device coupled to the at least one antenna and comprising a polyphase filter, the polyphase filter comprising:
a direct-current (DC) bias voltage node;
a plus in-phase filter unit comprising an input node, an output node, and a control node;
a minus in-phase filter unit comprising an input node, an output node, and a control node;
a plus quadrature-phase filter unit comprising an input node, an output node, and a control node;
a minus quadrature-phase filter unit comprising an input node, an output node, and a control node;
a plus in-phase switch coupled to the control node of the plus in-phase filter unit, the DC bias voltage node, and one or both of the input node of the plus quadrature-phase filter unit and the input node of the minus quadrature-phase filter unit; and
a minus in-phase switch coupled to the control node of the minus in-phase filter unit, the DC bias voltage node, and one or both of the input node of the plus quadrature-phase filter unit and the input node of the minus quadrature-phase filter unit;
a display screen; and
at least one processor operatively coupled to the display screen and the wireless interface device, the at least one processor configured to present one or more graphical images on the display screen based on one or more wireless signals received via the at least one antenna using the polyphase filter of the wireless interface device.

23. A filter, comprising:
a first filter unit comprising a first input node, a first output node, a first capacitor coupled between the first input node and ground, a first current source coupled to the first input node, and a first transconductor coupled between the first current source and the first output node, the first input node being coupled to a first mixer configured to provide a first phase signal component, the first current source comprising a transistor having a drain coupled to the first transconductor, a source coupled to a power distribution network node, and a gate;
a second filter unit comprising a second input node, a second output node, a second capacitor coupled between the second input node and ground, a second current source coupled to the second input node, and a second transconductor coupled between the second current source and the second output node, the second input node being coupled to a second mixer configured to provide a second phase signal component; and
means for selectively coupling the gate of the transistor to the second input node and for selectively coupling the gate of the transistor to a bias.

24. The filter of claim 23, wherein the first phase signal component comprises an in-phase signal component and the second phase signal component comprises a quadrature phase signal component.

25. The filter of claim 23, wherein the first output node is coupled to a first analog-to-digital converter (ADC) and the second output node is coupled to a second ADC, the filter is configured as a baseband filter, and the first and second phase signal components comprise components of a receive signal.

26. A method for operating at least one polyphase filter, the method comprising:
- propagating a plus in-phase signal component through a plus in-phase filter unit that comprises a control transistor;
- propagating a minus in-phase signal component through a minus in-phase filter unit that comprises a control transistor;
- propagating a plus quadrature-phase signal component through a plus quadrature-phase filter unit that comprises a control transistor;
- propagating a minus quadrature-phase signal component through a minus quadrature-phase filter unit that comprises a control transistor;
- selectively coupling the plus quadrature-phase signal component or the minus quadrature-phase signal component to a control terminal of the control transistor of the plus in-phase filter unit; and
- selectively coupling the plus quadrature-phase signal component or the minus quadrature-phase signal component to a control terminal of the control transistor of the minus in-phase filter unit.

27. The method of claim 26, further comprising:
- selectively coupling the plus in-phase signal component or the minus in-phase signal component to a control terminal of the control transistor of the plus quadrature-phase filter unit; and
- selectively coupling the plus in-phase signal component or the minus in-phase signal component to a control terminal of the control transistor of the minus quadrature-phase filter unit.

28. The method of claim 27, further comprising:
- selectively coupling a direct-current (DC) bias voltage to the control terminal of the control transistor of the plus in-phase filter unit;
- selectively coupling the DC bias voltage to the control terminal of the control transistor of the minus in-phase filter unit;
- selectively coupling the DC bias voltage to the control terminal of the control transistor of the plus quadrature-phase filter unit; and
- selectively coupling the DC bias voltage to the control terminal of the control transistor of the minus quadrature-phase filter unit.

29. The method of claim 28, further comprising:
- changing for the at least one polyphase filter a filter mode of multiple filter modes, the multiple filter modes comprising a lowpass filter mode, a positive frequency-shift filter mode, and a negative frequency-shift filter mode.

30. The method of claim 26, wherein:
- the at least one polyphase filter comprises a first polyphase filter and a second polyphase filter; and
- the method further comprises:
    - splitting an in-phase current to produce a first in-phase current and a second in-phase current;
    - routing the first in-phase current to provide the plus in-phase signal component and the minus in-phase signal component for the first polyphase filter, the first polyphase filter corresponding to a positive frequency-shift filter mode; and
    - routing the second in-phase current to the second polyphase filter, the second polyphase filter corresponding to a negative frequency-shift filter mode.

* * * * *